(12) United States Patent
Kimoto

(10) Patent No.: US 7,501,838 B2
(45) Date of Patent: Mar. 10, 2009

(54) CONTACT ASSEMBLY AND LSI CHIP INSPECTING DEVICE USING THE SAME

(76) Inventor: Gunsei Kimoto, 1-3-2-807, Daiba, Minato-ku (JP)

( * ) Notice: Subject to any disclaimer, the term of this patent is extended or adjusted under 35 U.S.C. 154(b) by 313 days.

(21) Appl. No.: 11/521,195

(22) Filed: Sep. 14, 2006

(65) Prior Publication Data

US 2007/0063718 A1  Mar. 22, 2007

(30) Foreign Application Priority Data

Sep. 19, 2005 (JP) ............................. 2005-304992

(51) Int. Cl.
*G01R 31/02* (2006.01)
(52) U.S. Cl. .................. 324/754; 324/761; 324/762
(58) Field of Classification Search ............. 324/754, 324/761, 762; 439/482, 824
See application file for complete search history.

(56) References Cited

U.S. PATENT DOCUMENTS 3,611,128 A * 10/1971 Nagata .................. 324/72.5
4,045,737 A *  8/1977 Coberly .................. 324/754
4,618,821 A * 10/1986 Lenz ..................... 324/754

FOREIGN PATENT DOCUMENTS

JP      2002-296295     10/2002

* cited by examiner

*Primary Examiner*—Ha Tran T Nguyen
*Assistant Examiner*—Richard Isla Rodas
(74) *Attorney, Agent, or Firm*—Haynes and Boone, LLP

(57) ABSTRACT

A contact assembly and an LSI chip inspecting device using the same are disclosed. The contact assembly is mounted between an electronic device to be tested and a circuit inspecting device to electrically connect them. The contact assembly includes contacts, each of which includes vertical type probes and a ribbon-shaped resin film to which the vertical type probes are mounted apart from each other in a longitudinal direction of the ribbon-shaped resin film, a position determining member for overlapping the contacts in a thickness direction of the contact such that the contacts are separated from each other, and fixing the contacts, and a guide block which is formed with an opening for receiving the contacts. The guide block is formed with a recess in which the position determining member is seated, so that terminals of the vertical type probes protrude above and below surface planes of the guide block, perpendicularly thereto. The position of the contacts, which are arranged with a predetermined angle with respect to an X-axis of arrangement of terminals mounted on XY perpendicular coordinates, can be retained very accurately, and an assembling process is facilitated.

10 Claims, 29 Drawing Sheets

CONTACT ASSEMBLY AND LSI CHIP INSPECTING DEVICE USING THE SAME

CROSS REFERENCED TO RELATED APPLICATIONS

This application claims priority to Japanese patent application serial No.2005-304992, filed Sep. 19, 2005.

BACKGROUND OF THE INVENTION

1. Field of the Invention

The present invention relates to a contact assembly, and more particularly to a contact assembly which is used for a circuit inspection of a semiconductor integrated circuit chip having electrodes (pads) and a liquid crystal device, and used in a socket for a CSP (Chip Size Package) on which circuit terminals are arranged in a lattice shape. The present invention also relates to a retaining structure for retaining highly-accurate position of contacts. The present invention further relates to an LSI (Large-scale integrated) chip inspecting device and a circuit inspecting device of the CSP or the like using the above contact assembly and the contact retaining structure.

2. Description of the Related Art

A contact assembly of a prior art is disclosed in FIG. 3 of Japanese Patent Laid-open Publication No. 2002-296295. The contact assembly of the prior art includes plural contacts, which have a thin plate shape and input and output parts. An elastic deforming part (a curved part), which is elastically deformed by an external force, is formed between the input part and the output part of each contact. In order to cope with narrow-pitched arrangement of chip pads mounted on a wafer, the contacts are arranged with a predetermined angle without interference therebetween, with respect to an X-axis of the arrangement of terminals mounted on XY perpendicular coordinates (hereinafter, this arrangement structure will be called the contact assembly).

In general, in order to determine and retain accurate position of the contacts in, e.g., a connector, connecting parts (which are typically called a terminal) are forcibly inserted through supporting holes formed at a rigid body. However, it is difficult to form the supporting holes at the rigid body which is generally manufactured by a molding, corresponding to the narrow-pitch arrangement.

The above contact assembly of the prior art is disclosed in FIG. 29 (FIG. 5 of Japanese Patent Laid-open Publication No. 2002-296295). FIG. 29 is a front view showing the prior art contact assembly retaining instrument. As shown in the drawing, contacts 1 are supported by a sheet-shaped body 27 in such a manner that output terminals 6 of the contacts 1 are inserted through supporting holes formed at the body 27. And, input terminals 5 of the contacts 1 are inserted through guide holes formed at a guide sheet 28 which is located on the contacts 1. The above components are fixed by connecting posts 25 and supporting posts 26, so as to electrically connect an electronic device to be tested to an inspecting circuit board. However, such a supporting structure of the contact assembly is of no practical use.

Therefore, the present invention has been made in view of the above problems, and it is an object of the present invention to provide a contact assembly and an LSI chip inspecting device using the same capable of retaining highly accurate position of contacts of a contact assembly, which are arranged in parallel with each other without interference and arranged with a predetermined angle with respect to an X-axis of arrangement of terminals mounted on XY perpendicular coordinates.

It is another object of the present invention to provide a contact assembly and LSI chip inspecting device using the same, an assembling process of which can be facilitated.

SUMMARY OF THE INVENTION

In accordance with the present invention, the above and other objects can be accomplished by the provision of a contact assembly mounted between an electronic device to be tested and a circuit inspecting device to electrically connect the electronic device to the circuit inspecting device, the contact assembly comprising: contacts, each of which includes vertical type probes and a ribbon-shaped resin film to which the vertical type probes are mounted apart from each other in a longitudinal direction of the ribbon-shaped resin film, each of the vertical type probes including a first terminal which contacts a pad of the electronic device to be tested, a second terminal which contacts a pad of the circuit inspecting device, and an elastic deforming part which is formed between the first terminal and the second terminal; a position determining member for overlapping the contacts in the longitudinal direction of the contact such that the contacts are separated from each other and the vertical type probes are arranged misalignedly by a predetermined pitch in the longitudinal direction of the ribbon-shaped resin film, and fixing the contacts in a width direction; and a guide block that is formed with an opening for receiving the contacts fixed by the position determining member and recesses in which the position determining member is seated, the guide block having a thickness which is substantially same as a width of the contact. The first terminals and the second terminals of the vertical type probes protrude above and below surface planes of the guide block, respectively.

The elastic deforming part is formed in a U-shaped curve which extends along the longitudinal direction of the ribbon-shaped resin film, and the first terminal and the second terminal are formed at both ends of the elastic deforming part and protrude outward perpendicular to both longitudinal sides of the ribbon-shaped resin film. The ribbon-shaped resin film is formed with a slot at a location surrounded by the elastic deforming part.

The vertical type probes have the ends of the curve protruding perpendicularly from both sides in the longitudinal direction of the ribbon-shaped resin film, the first terminal being an input terminal which contacts the pad of the electronic device to be tested, and the second terminal being an output terminal which contacts a circuit wire pad of an inspecting circuit board.

The ribbon-shaped resin film is connected to the vertical type probe by a beam structure, the beam being a portion adjacent to the slot of the ribbon-shaped resin film having the same width as a width of the elastic deforming part. When a contacting pressure is applied to the vertical type probe, the ribbon-shaped resin film is deformed elastically together with the vertical type probe.

The first terminals and the second terminals of the vertical type probes which are overlapped are arranged linearly with an angle which is derived from the following equation:

$$\sin\theta = t/p$$

where $\theta$ means the angle, t means a thickness of the contact, and p means a pitch of the pads of the electronic device to be tested, which are arranged in a lattice shape.

The position determining member is a coupling rod, and the contacts are all formed with through-holes through which the coupling rod is inserted for fixing the contacts which are overlapped so that the first terminals of the vertical type probes correspond to the pads of the electronic device to be tested.

The electronic device to be tested in contact with the input terminal protruding from the guide block is mounted slantly with the angle θ with respect to a longitudinal direction of the guide block.

The circuit inspecting device includes at least one inspection circuit board having circuit wires which contact the second terminal protruding from the guide block. The inspection circuit board is formed with an extending portion which is inserted into a connector socket to electrically connect the electronic device to be tested to the circuit inspecting device.

The circuit inspecting device includes an upper inspection circuit board and a lower inspection circuit board disposed under the upper inspection circuit board. The upper inspection circuit board is formed with through-holes through which parts of the second terminals of the vertical type probes pass to contact circuit wire pads of the lower inspection circuit board.

According to the prevent invention, the position of the contacts, which are arranged with a predetermined angle with respect to an X-axis of arrangement of input and output terminals mounted on XY perpendicular coordinates, can be retained very accurately, and an assembling process is facilitated by providing a retaining structure of a contact assembly with use of a guide block.

BRIEF DESCRIPTION OF THE DRAWINGS

The above and other objects, features and other advantages of the present invention will be more clearly understood from the following detailed description taken in conjunction with the accompanying drawings, in which:

FIG. 27 is a schematic diagram showing arrangement of wafer chip terminals and signal arriving positions of a coordinate transformation circuit after a coordinate transformation process depicted in FIG. 26;

DESCRIPTION OF THE PREFERRED EMBODIMENTS

Figure 1:
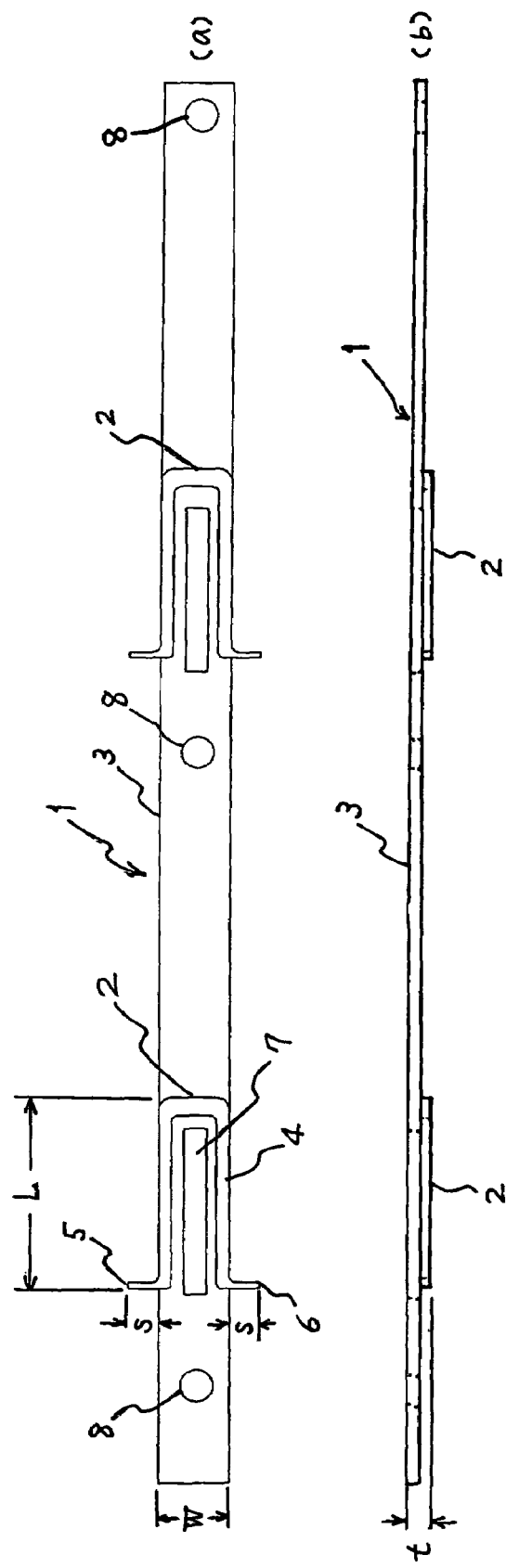
FIGS. 1A and 1B show a contact in accordance with a first embodiment of the present invention, in which 1A is a front view and 1B is a plan view.

Defining inspecting devices related to the present invention, a circuit inspecting device means a device for inspecting an electronic device to be tested, which is electrically connected to a contact assembly. Such a circuit inspecting device is not illustrated concretely in the drawings of the present invention. The electronic device to be tested, which is used in the present invention, is a CSP, a FPGA (Field Programmable Gate Array) or the like, in which input and output terminals are arranged in a lattice shape. An LSI chip inspecting device means a device which simultaneously contacts overall pads of an LSI chip arranged on a wafer, and tests various electric features.

First Embodiment

Now, a first embodiment of the present invention will be described with reference to the annexed drawings. FIGS. 1A and 1B are a front view and a plan view showing a contact in accordance with a first embodiment of the present invention, respectively. As shown in the drawings, a contact 1 includes a ribbon-shaped resin film 3 and a vertical type probe 2 formed on a surface of the resin film 3. A polyimide may be used as the ribbon-shaped resin film 3, and a copper foil may be used as the vertical type probe 2 which sticks onto the surface of the resin film 3. The contact 1 is manufactured by a well-known etching process according to a photolithography method. It is preferable to use a beryllium copper as the material of the copper foil, because the probe should have rigidity.

Through the above manufacturing process, the contact 1 is formed such that the vertical type probe 2 is integral with the ribbon-shaped resin film 3 (a thickness of t and a width of W). The vertical type probe 2 is formed in a U-shaped curve, which has a length of L and a width of W. The U-shaped probe 2 extends along a longitudinal direction of the ribbon-shaped resin film 3, and has the substantially same width as the resin film 3. Two front ends adjacent to an opening of the U-shaped probe 2 protrude outward perpendicular to both longitudinal sides of the ribbon-shaped resin film 3. One front end of the U-shaped probe 2 forms an input terminal 5, and the other front end forms an output terminal 6. The input and output terminals 5 and 6 have a height of s. The input terminal 5 contacts a pad of an electronic device to be tested, and the output terminal 6 contacts a pad of an inspecting circuit, so as to achieve an electric connection between the electronic device to be tested and the inspecting circuit. Although it is illustrated in FIGS. 1A and 1B that two vertical type probes 2 are formed at one contact 1, the number of the probes may be changed according to the number of the pads of the electronic device to be tested.

The ribbon-shaped resin film 3 is formed with a slot 7 at a location surrounded by a U-shaped elastic deforming part 4 of the vertical type probe 2. An opening area of the slot 7 is almost same as an area of the location surrounded by the U-shaped elastic deforming part 4. The ribbon-shaped resin film 3 is connected to the vertical type probe 2 by a beam structure (it is a very narrow beam structure). The beam is a portion adjacent to the slot 7 of the resin film 3, of which a width is almost same as a width of the elastic deforming part 4. When a contacting pressure is applied to the input terminal 5 and the output terminal 6, the vertical type probe 2 and the ribbon-shaped resin film 3 are deformed elastically together. The ribbon-shaped resin film 3 is formed with plural through-holes 8 for position determination (three through-holes 8 are illustrated in FIGS. 1A and 1B), which will be described in detail later.

Figure 2:
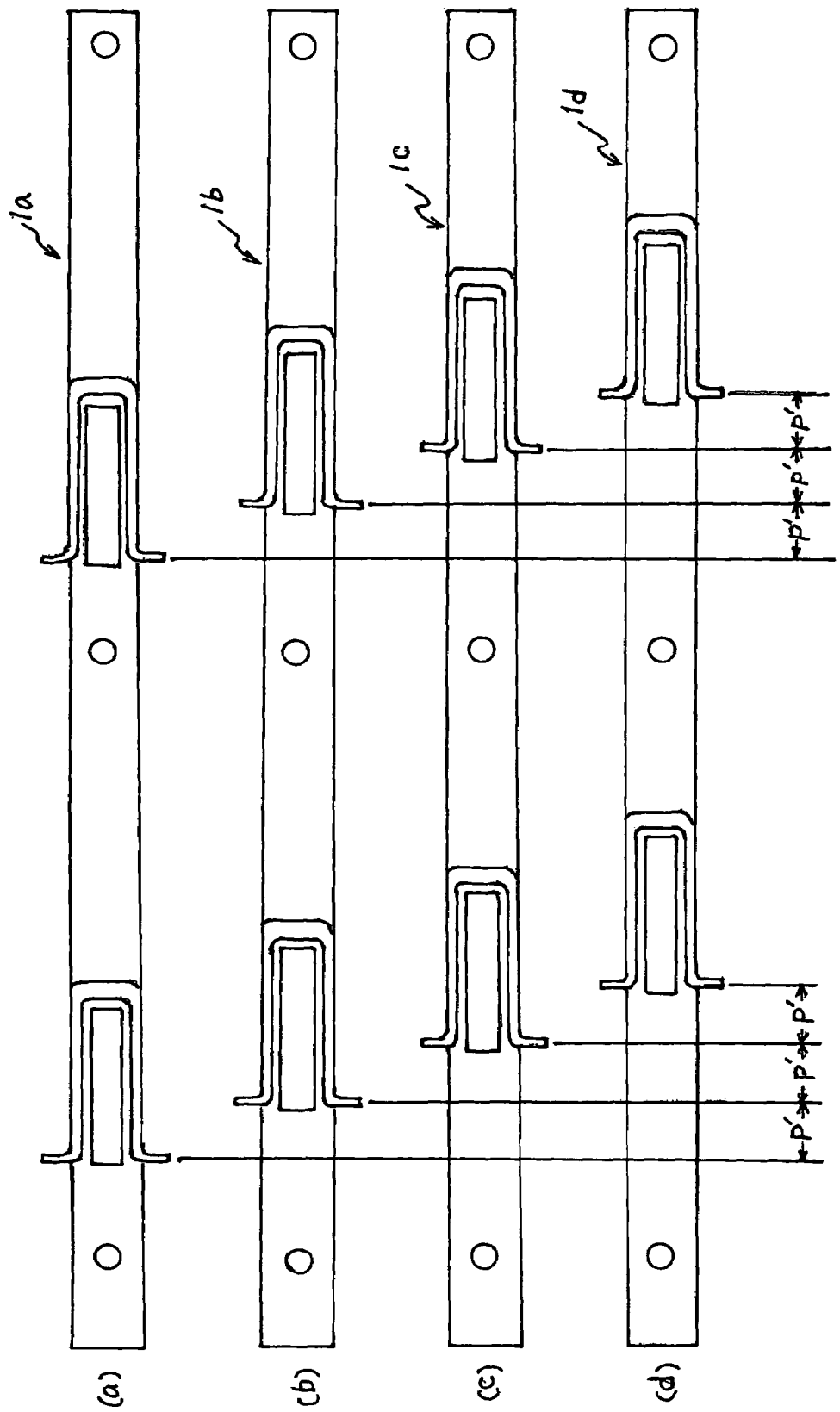
FIGS. 2A to 2D are front views showing a contact in accordance with the first embodiment, in which 2A, 2B, 2C and 2D respectively show four different kinds of contacts.

A contact assembly is formed by providing the plural contacts 1 constructed as above and overlapping the same. At this time, the plural contacts 1 have different structures from each other such that the vertical type probes 2 of the contacts 1 are arranged misalignedly by one pitch, which will now be described in detail with reference to FIGS. 2A to 2B. FIG. 2A shows a contact 1a depicted in FIGS. 1A and 1B. FIG. 2B shows a contact 1b whose vertical type probe 2 is misaligned from the vertical type probe 2 of the probe 1a in FIG. 2A by one pitch p'. FIG. 2C shows a contact 1c whose vertical type probe 2 is further misaligned from the vertical type probe 2 of the probe 1b in FIG. 2B by one pitch p'. FIG. 2D shows a contact 1d whose vertical type probe 2 is further misaligned from the vertical type probe 2 of the probe 1c in FIG. 2c by one pitch p'. Although four contacts 1a, 1b, 1c and 1d are shown in FIGS. 2A and 2B, the number of the contacts may be changed according to the number of pads of the electronic device to be tested. The length of the pitch p' will be explained later.

If considering that the plural vertical type probes 2 are formed on one contact 1 corresponding to the pitch array of the pads of the electronic device to be tested, because the pitch of the pads of the electronic device is very small, a gap between two adjacent vertical type probes 2 becomes also very narrow, and the space for mounting the U-shaped elastic deforming part (the curved part) 4 cannot be provided. For this reason, the contact assembly according to the present invention is configured such that the plural contacts 1 having the vertical type probes 2 with the elastic deforming part 4 are overlapped, and are arranged with a predetermined angle without interference with each other, with respect to an X-axis of the pitch array of the pads of the electronic device to be tested disposed on XY rectangular coordinates. Since the contact assembly has a structure that the vertical type probes 2 are integrally adhered to the ribbon-shaped resin film 3, when the contacts are overlapped, the conductive vertical type probes 2 and the insulative ribbon-shaped resin films 3 are arranged alternately. Thus, the insulation is maintained as a whole.

Figure 3:
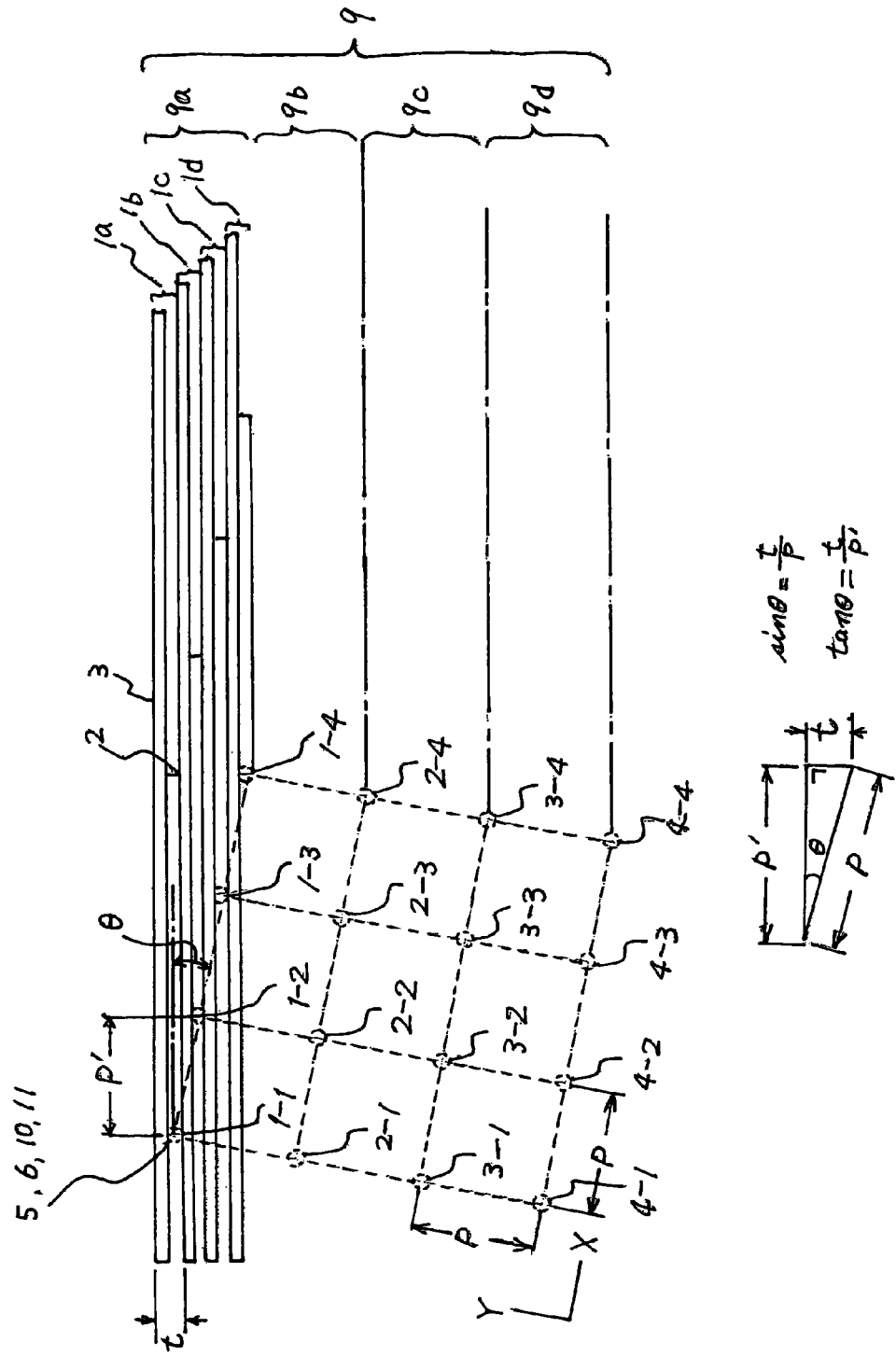
FIG. 3 is a partial plan view showing a constitution and function of a contact assembly in accordance with the first embodiment.

FIG. 3 is a plan view showing the arrangement of the contacts 1 of the contact assembly where the plural contacts 1 are overlapped. Since the contacts 1 are provided in plural, the input terminals 5 and the output terminals 6 are also provided in plural. The input terminals 5 and the output terminals 6 are positioned in the X-axis direction and Y-axis direction on the XY rectangular coordinates. Also, the input terminals 5 and the output terminals 6 are arranged with a pitch p in the X-axis direction and Y-axis direction.

The plural pads 10 of the electronic device to be tested or pads 11 of the inspection circuit are arranged in a lattice shape. The X-axis and Y-axis of the XY rectangular coordinates are set along the directions of a row and a column of the lattice of the plural pads 10 of the electronic device to be tested or the pads 11 of the inspection circuit. The pitch p between two adjacent contacts 1 in the X-axis direction and Y-axis direction on the XY rectangular coordinates corresponds to a pitch of the lattice of the plural pads 10 of the electronic device to be tested or the pads 11 of the inspection circuit.

An angle θ in FIG. 3 means an angle between a longitudinal side of the ribbon-shaped contact 1 and the X-axis of the XY perpendicular coordinates. By overlapping the plural contacts 1 which have a feature that the length L of the vertical type probe 2 is larger than the pitch p (L>p), the terminals of the vertical type probes 2 can be arranged linearly with the angle θ with respect to the X-axis. The angle θ can be derived from the following equation.

$$\sin \theta = t/p$$

Here, t means the thickness of the contact 1 (a total thickness of the vertical type probe 2 and the ribbon-shaped resin film 3), and p means the pitch of the pads of the electronic device to be tested.

As shown in FIG. 3, if sixteen (4×4) pads are arranged with the pitch p in the lattice shape in the XY directions in one electronic device to be tested, the contact assembly 9a is constructed in such a manner that four contacts 1a to 1d are overlapped so that the vertical type probes 2 of the contacts 1a to 1d are misaligned with each other by the pitch p' and the input terminals 5 of the vertical type probes 2 contact the pads 1-1, 1-2, 1-3 and 1-4 in the first row, respectively. Here, p' is derived from the following equation.

$$P' = t/\tan\theta$$

In the same manner, the contact assembly 9b is constructed such that input terminals of the vertical type probes contact the pads 2-1, 2-2, 2-3 and 2-4 in the second row, respectively. The contact assembly 9c is constructed such that input terminals of the vertical type probes contact the pads 3-1, 3-2, 3-3 and 3-4 in the third row, respectively. The contact assembly 9d is constructed such that input terminals of the vertical type probes contact the pads 4-1, 4-2, 4-3 and 4-4 in the fourth row, respectively. The contact assembly 9 is formed by integrally combining the contact assemblies 9a to 9d. As a result, the contact assembly 9 can simultaneously contact all of sixteen pads which are disposed in the lattice shape. Also, when the contact assembly 9 is formed by using contacts 1 having two vertical type probes 2 as shown in FIGS. 1A and 1B, the contact assembly 9 can simultaneously contact all of the pads of two electronic devices to be tested.

Figure 4:
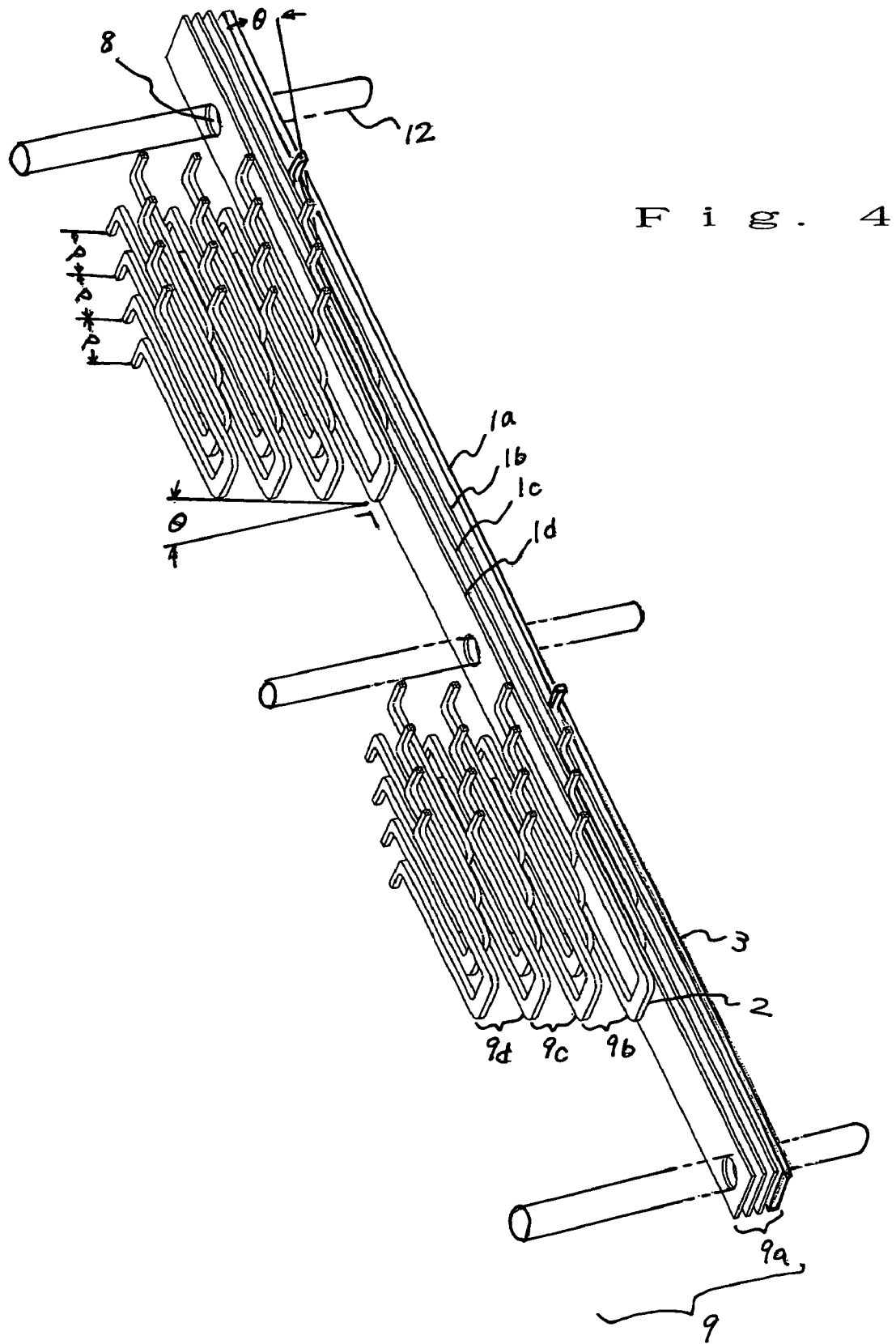
FIG. 4 is a perspective view showing a constitution of a contact assembly in accordance with the first embodiment.

A structure of assembling and retaining the contact assemblies 9a to 9d will be described with reference to FIG. 4. In this embodiment, the structure of overlapping four contacts 1a to 1d, each of which includes two vertical type probes 2 formed on one ribbon-shaped resin film 3, is used as an example. FIG. 4 is a perspective view showing the contact assembly 9 constructed by integrally combining the contact assemblies 9a to 9d, each of which is structured by overlapping four contacts 1a to 1d. In FIG. 4, only four ribbon-shaped resin films 3 constituting the contact assembly 9a are illustrated, and twelve ribbon-shaped resin films constituting the contact assemblies 9b to 9d are omitted.

All of sixteen ribbon-shaped resin films 3 are formed with through-holes 8 at the same position, which have the same diameter. In this embodiment, three through-holes 8 are formed at each ribbon-shaped resin film 3, more particularly, at both end portions and middle portion of each ribbon-shaped resin film 3. When assembling the contact assembly 9, coupling rods 12 are respectively inserted through the through-holes 8, so that the position of the vertical type probes 2 is determined and sixteen contacts 1 are fixed together. It is preferable that the coupling rods 12 are fittingly inserted through the through-holes 8. The shape of the coupling rod 12 may be modified such that an end is formed in a conic shape, so as to be easily inserted through the through-holes 8.

As such, the contact assembly 9 has sixteen input terminals 5 which protrude upward, and sixteen output terminals 6 which protrude downward. The input terminals 5 contact the pads of the electronic device to be tested, and the output terminals 6 contact the pads of the inspection circuit. The input terminals 5 and the output terminals 6 are arranged, sixteen of them each, in the lattice shape, and the lattice-arranged terminals 5 and 6 are disposed as a whole with a rotating angle $\theta$ with respect to the XY perpendicular coordinates.

Figure 5:
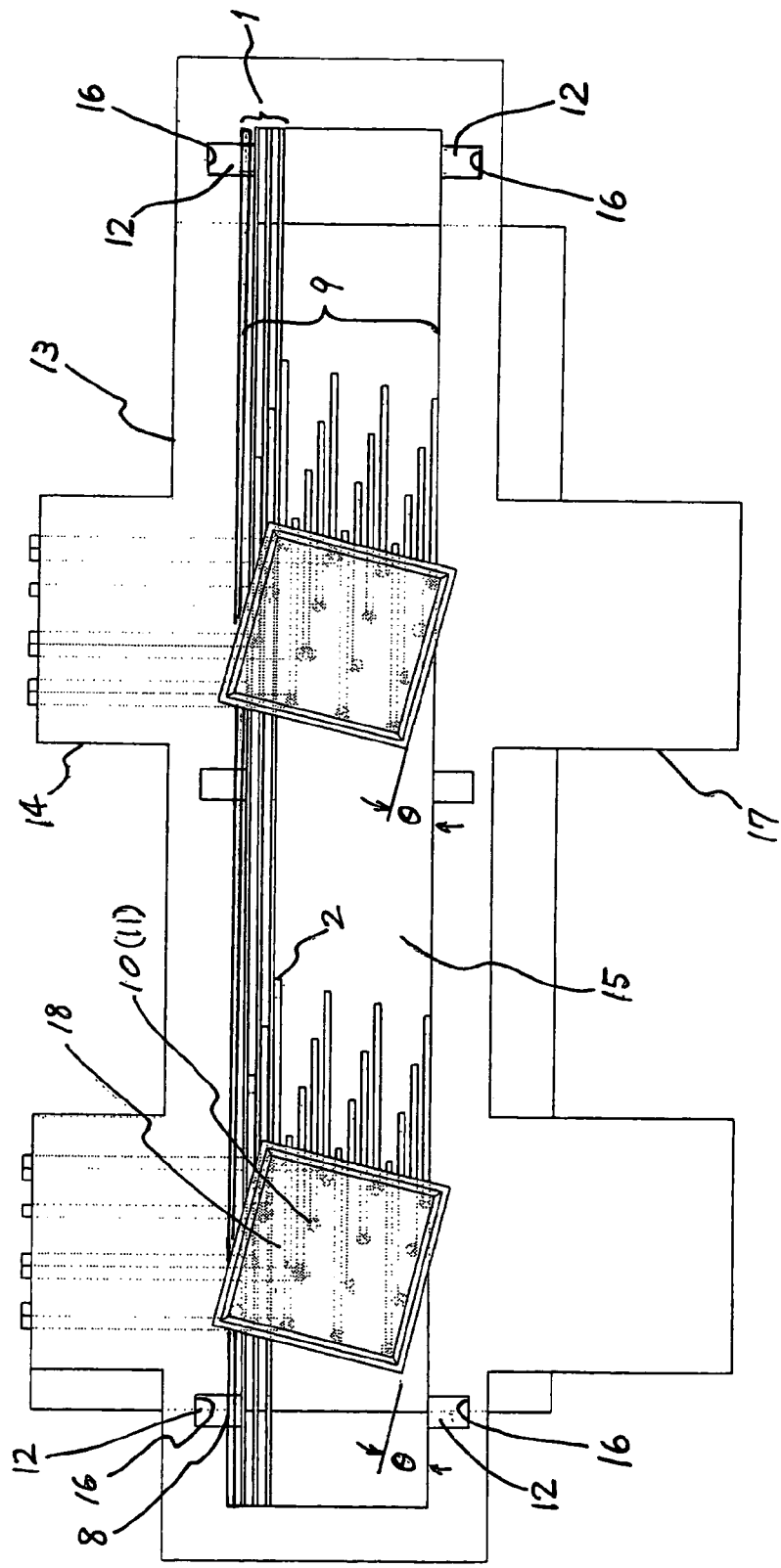
FIG. 5 is a plan view showing a constitution and function of a retaining instrument for a contact assembly in accordance with the first embodiment.
Figure 6:
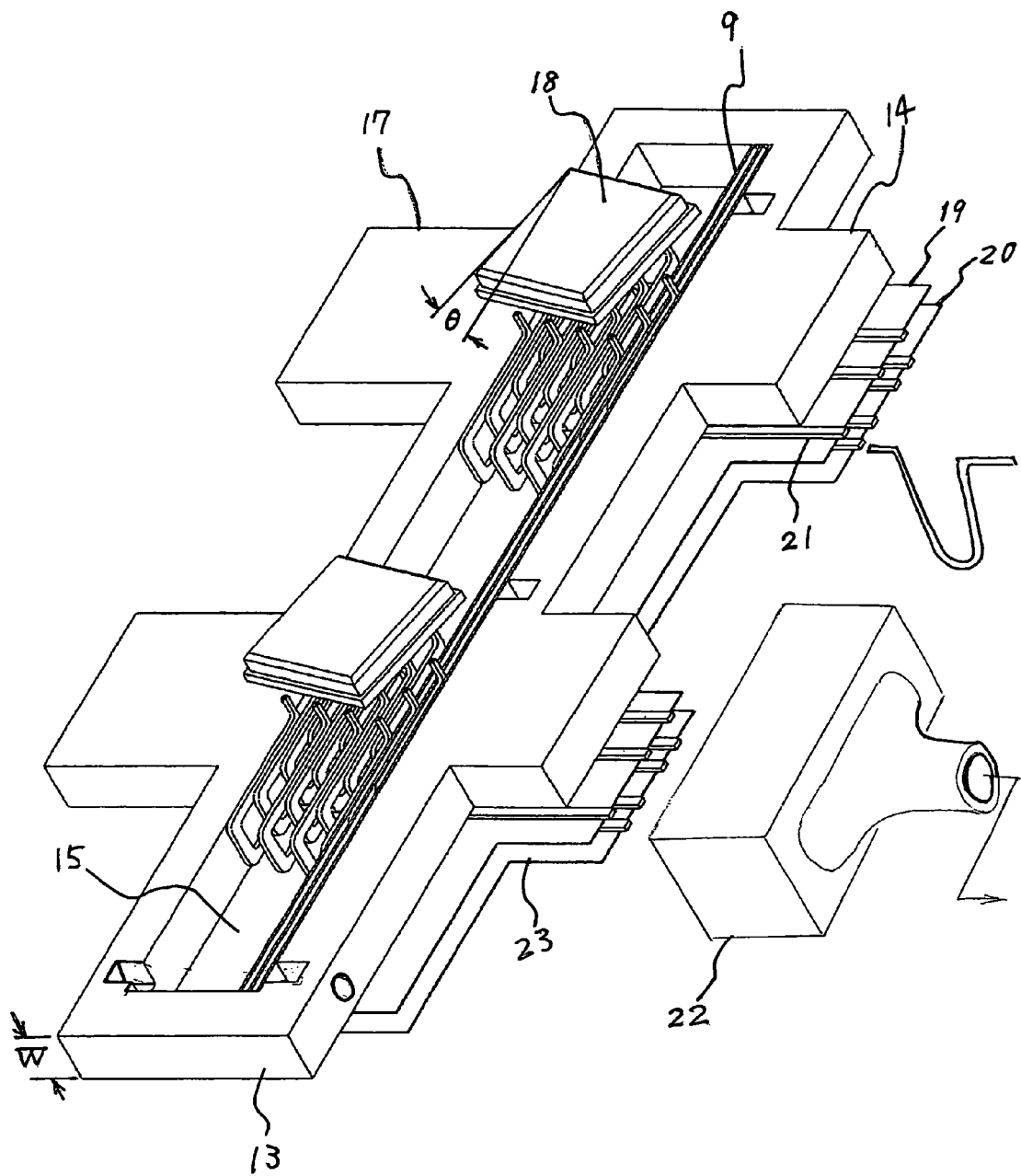
FIG. 6 is a perspective view showing a constitution and function of a retaining instrument for a contact assembly in accordance with the first embodiment.

The retaining structure of the contact assembly described in FIG. 4 will be described with reference to FIGS. 5 and 6. FIGS. 5 and 6 are a plan view and a perspective view showing the retaining structure, respectively. FIGS. 5 and 6 also show a connector structure which is connected to the inspection circuit.

As shown in FIGS. 5 and 6, the retaining structure of the contact assembly 9 includes a plate-shaped guide block 13 which is made from an insulative material such as resin, ceramics, quartz or the like. The guide block 13 has the same thickness as the width W of the ribbon-shaped resin film 3. The guide block 13 has a frame structure and is provided with a rectangular opening 15 in which the contact assembly 9 is fittingly received. The guide block 13 is formed with recesses 16 in which both end portions of the respective coupling rods 12 used for assembling the contact assembly 9 are seated. The recesses 16 are positioned symmetrically along both longitudinal sides of the opening 15.

Preferably, a depth of each recess 16 is set so that the position of the surface of the contact assembly 9 can coincide with the position of the surface of the guide block 13. Thus, the input terminals 5 and the output terminals 6 protrude over the surface plane of the guide block 13. As such, the position of the contact assembly 9 can be precisely determined, and the assembling process can be simplified. Further, since the lengthwise or widthwise expansion of the contact assembly 9 is suppressed by the guide block 13, although the minute pads of the electronic device to be tested are precisely arranged, the probing can be performed accurately and high stability with respect to thermal expansion can be obtained.

The guide block 13 is formed with extending portions 14 and 17, which extend from both longitudinal sides of areas, where the input terminals 5 and the output terminals 6 are disposed, of the guide block 13 when the contact assembly 9 is inserted. The extending portions 14 and 17 insulatively cover circuit wires of a connector (which will be described later), or reinforce an inspection circuit board.

As seen from FIG. 6, the input terminals 5 of the contact assembly 9, which is mounted to the guide block 13, simultaneously contact pads 10 (sixteen pads in this embodiment) mounted to a rear surface of the electronic device 18 to be tested. At this time, the electronic device 18 to be tested is located slantly by the angle $\theta$ with respect to the XY directions of the guide block 13, as described above. The electronic device 18 to be tested is brought in this arrangement by feeding means, position-determining means, pressing means and the like (which are not shown in the drawings). FIG. 6 shows a state that two electronic devices 18 to be tested are fed to the contact assembly 9 and guide block 13 at the same time.

On the other hand, the output terminals 6 of the contact assembly 9 protrude from a lower surface of the guide block 13, and simultaneously contact pads 11 (see FIG. 7) of circuit wires 21 of an inspection circuit board 19. The inspection circuit board 19 is a printed circuit board, a flexible wiring board or the like. According to necessity, the inspection circuit board 19 is provided in plural and overlapped, and extending portions 23 of the inspection circuit board 19 are inserted into a connector socket 22, so as to be electrically connected to the circuit inspecting device.

Figure 7:
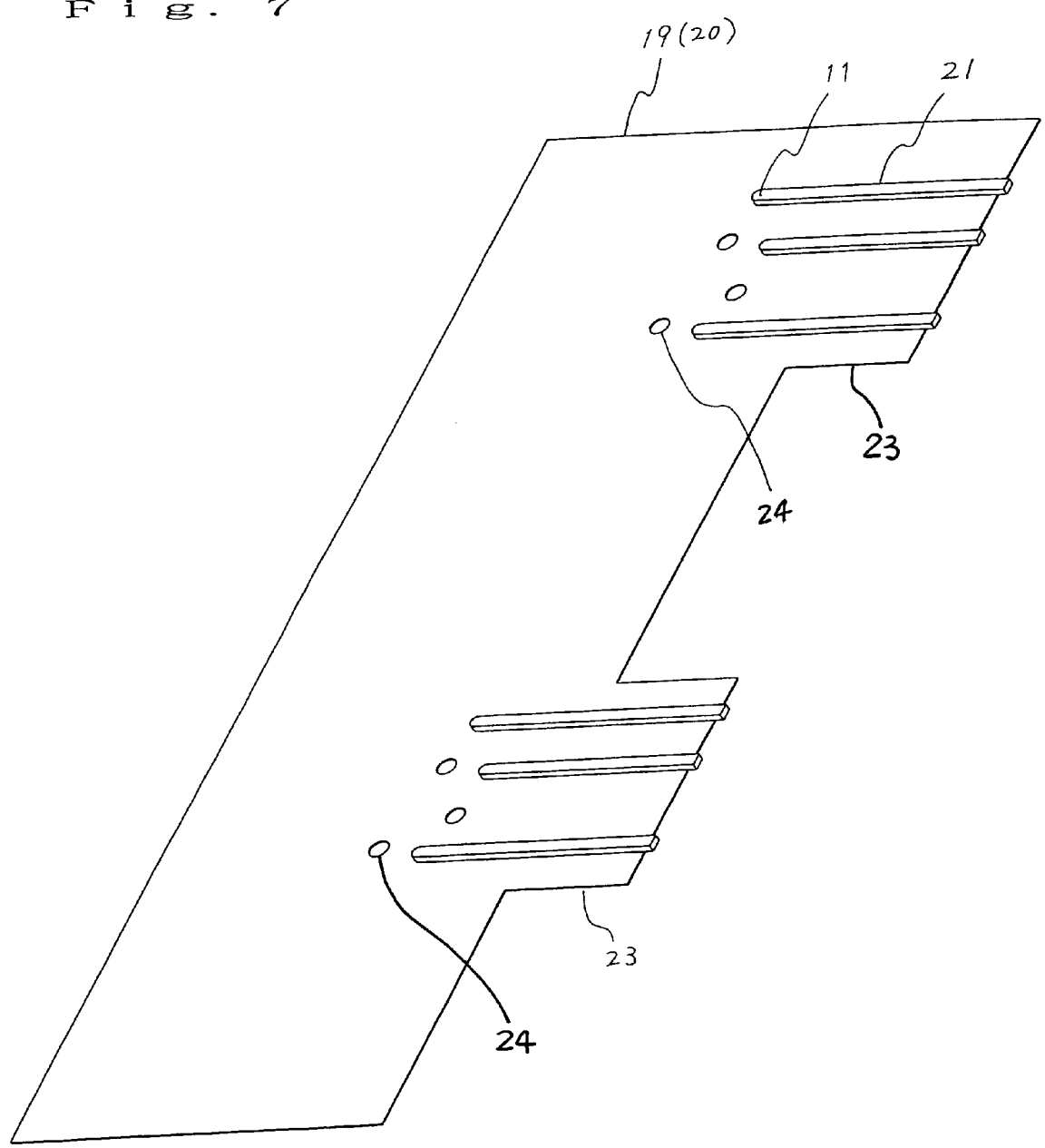
FIG. 7 is a perspective view showing an inspecting circuit board for connecting a circuit inspecting device to a contact assembly in accordance with the first embodiment.

FIG. 7 is a perspective view showing an example of the inspection circuit board. The inspection circuit board 19 has the circuit wires 21 patterned with copper foil on the flexible film of polyimide and the like, and is formed with the extending portions 23 for connection with the connector sockets. The circuit wires 21 are positioned corresponding to the output terminals 6. It can be seen from FIG. 7 that three output terminals 6 contact three circuit wires 21.

The inspection circuit board 19 is formed with through-holes 24. When one inspection circuit board is not enough, for example, when two inspection circuit boards 19 and 20 are needed as shown in FIG. 6, parts of the output terminals 6 pass through the through-holes 24 and contact the circuit wires 21 of the lower inspection circuit board 20. It is illustrated in FIG. 7 that three through-holes 24 are formed at one division unit of the upper inspection circuit board 19, however, this is not limited thereto. The lower inspection circuit board 20 may also be formed with through-holes, so three inspection circuit boards may be provided in total.

If the total thickness of the overlapped inspection circuit boards 19 and 20 is smaller than the height of the output terminals 6, since the front ends of the output terminals 6 protrude from the overlapped inspection circuit boards through the through-holes, there is no problem in that the output terminals 6 contact the circuit wires 21. A contacting pressure of the output terminals 6 has a little difference according to the upper and lower inspection circuit boards. However, the difference can be within a tolerance range by the long elastic deforming part of the vertical type probe.

Modified Example of First Embodiment

It is an object of a modified example of the first embodiment to replace the electronic device to be tested with a programmable electronic component (or a signal composition circuit which will be described later) such as a lattice-arranged CPLD (Complex Programmable Logic Device), a FPGA or the like, to electrically connect the programmable electronic component to pads of a chip mounted on a wafer by using the structure of the first embodiment, and to electrically connect the pads of the wafer chip to, e.g., a common-use external tester on the market or a memory-equipped computer (which will be described later in a third embodiment) with a small number of wires.

When connecting the input and output terminals of the lattice-arranged CPLD or FPGA to the narrow-pitched wires, the conventional PCB has a problem that relatively large through-holes are formed at the conventional PCB and the CPLD or FPGA cannot be mounted in high-density, compared with the modified example of the first embodiment. When substituting the PCB with a ceramic board for high-density mounting, it increases manufacturing costs.

In the first embodiment and the modified example thereof, the inspection circuit board is made of a flexible film and has a thickness of about 20 to 30 μm. And, a thickness of wires is in the range of about 20 to 30 μm. An anisotropic polymer 53 has a thickness of about 0.2 mm, and the vertical type probe 2 for constantly applying a contacting force to a contact point has a thickness of about 0.6 mm. Accordingly, a gap between the input/output terminals of the CPLD or FPGA and the inspection circuit board becomes small, and the CPLD or FPGA can be mounted in high-density.

Figure 8:
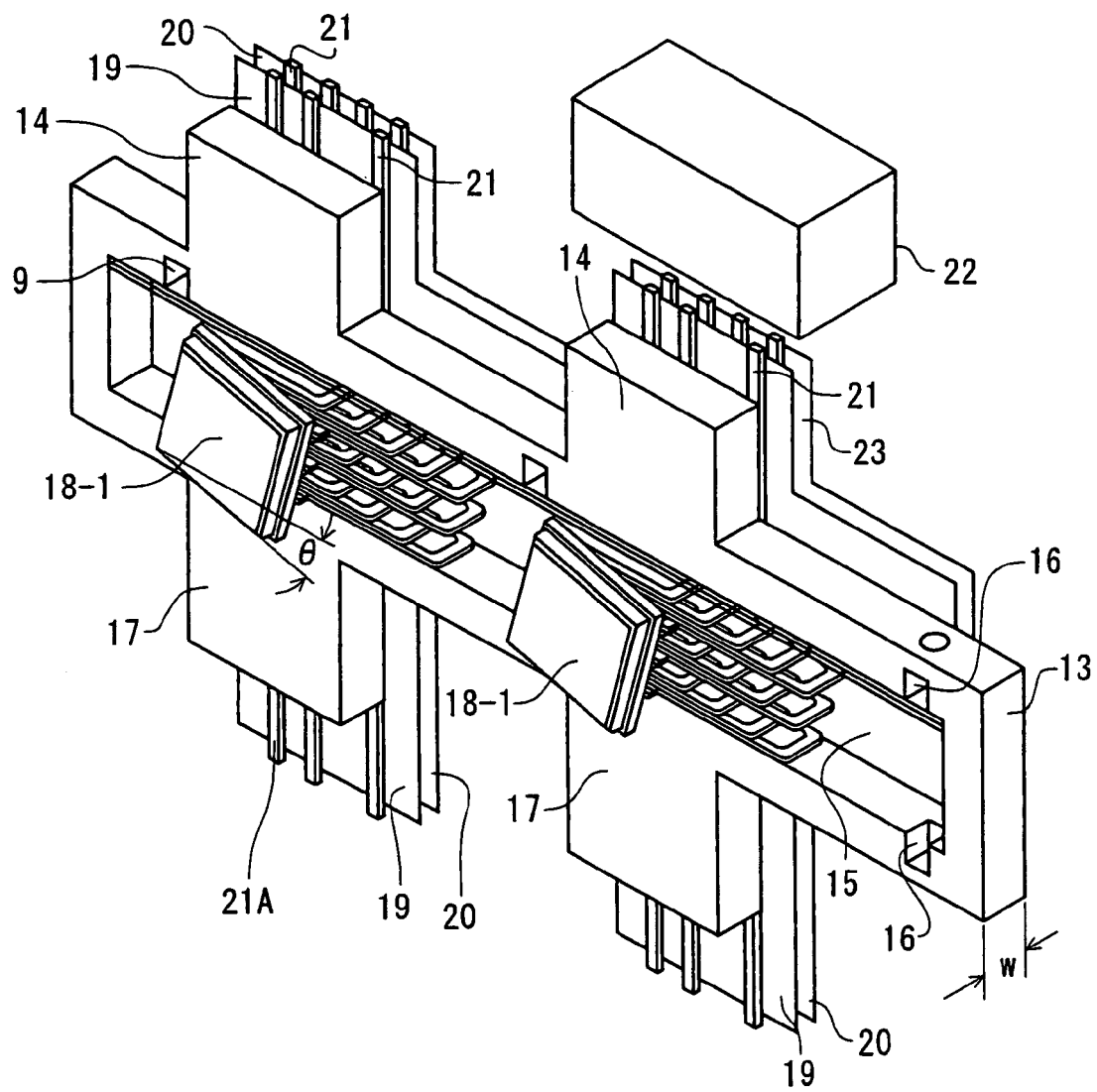
FIG. 8 is a perspective view showing a constitution and function of a retaining instrument of a contact assembly in accordance with a modified example of the first embodiment.

The modified example of the first embodiment will now be described with reference to FIG. 8. FIG. 8 is a perspective view showing a constitution and function of a retaining instrument for the contact assembly, which is used in the modified example of the first embodiment. The structure of the retaining instrument depicted in FIG. 8 is substantially same as that of the retaining instrument of the first embodiment, except that circuit wires 21A are provided additionally to the circuit wires 21 on the inspection circuit boards 19 and 20, and the electronic device 18 to be tested (see FIG. 6) is replaced by a programmable electronic device 18-1 such as the CPLD or FPGA which has a similar structure to the electronic device 18.

Figure 9:
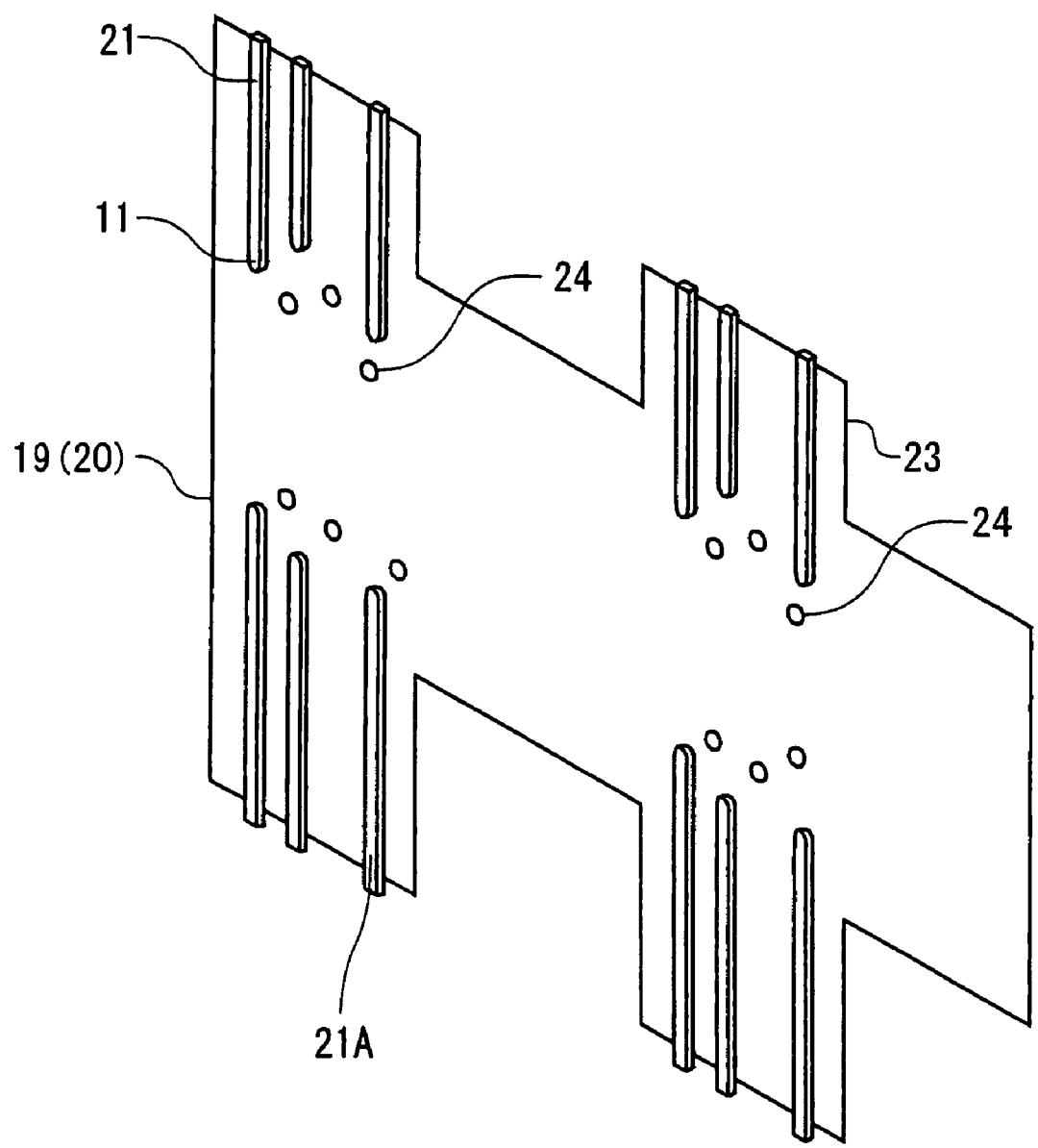
FIG. 9 is a perspective view showing an inspecting circuit board for connecting a circuit inspecting device to a contact assembly in accordance with a modified example of the first embodiment.

FIG. 9 is a perspective view showing the inspection circuit board used in the modified example of the first embodiment, which is connected to the contact assembly and the external tester or the memory-equipped computer. As shown in the drawing, the circuit wires 21A are provided additionally to the circuit wires 21 of the first embodiment on the inspection circuit board 19. Also, as shown in FIGS. 8 and 9, the circuit wires 21 and 21A are electrically connected to the terminals of the programmable electronic device 18-1. The circuit wires 21 and 21A are connected with signal cables and power cables so as to receive signals from an upper inspection circuit or the memory-equipped computer and to drive the programmable electronic device 18-1.

The circuit wires 21 and 21A are also used for input/output communication signal circuits of the programmable electronic device 18-1. For example, the circuit wires 21 and 21A are connected to the pads of the chip arranged on the wafer, so that the circuit inspection of the chip can be achieved.

Second Embodiment

A second embodiment of the present invention will now be described with reference to the annexed drawings. The second embodiment has structural characteristics that the coupling rods 12 of the first embodiment for supporting the overlapped contacts 1 are eliminated. In other words, the overlapped ribbon-shaped resin films are fixedly adhered to each other by partially coating adhesive agent on the surfaces of the ribbon-shaped resin films. A gap between two adjacent ribbon-shaped resin films is defined by a thickness of the adhesive agent partially coated on the surfaces of the ribbon-shaped resin films.

Figure 10:
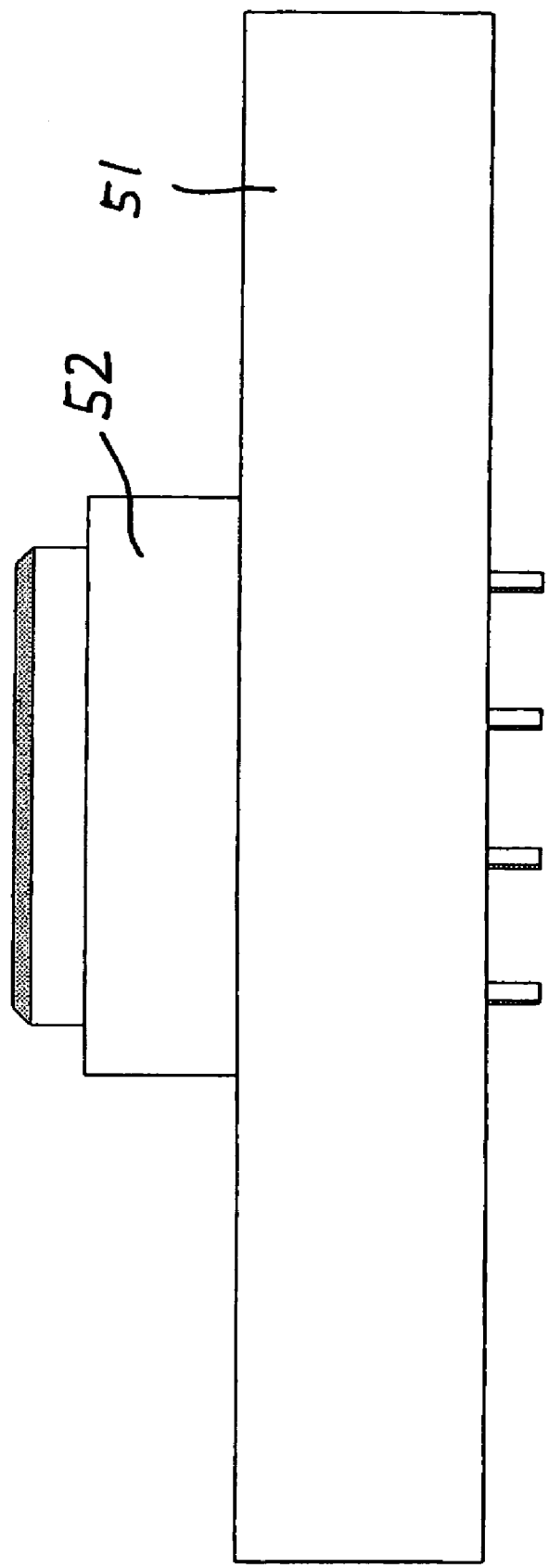
FIG. 10 is a side view showing an electronic component which is used in a second embodiment of the present invention.
Figure 11:
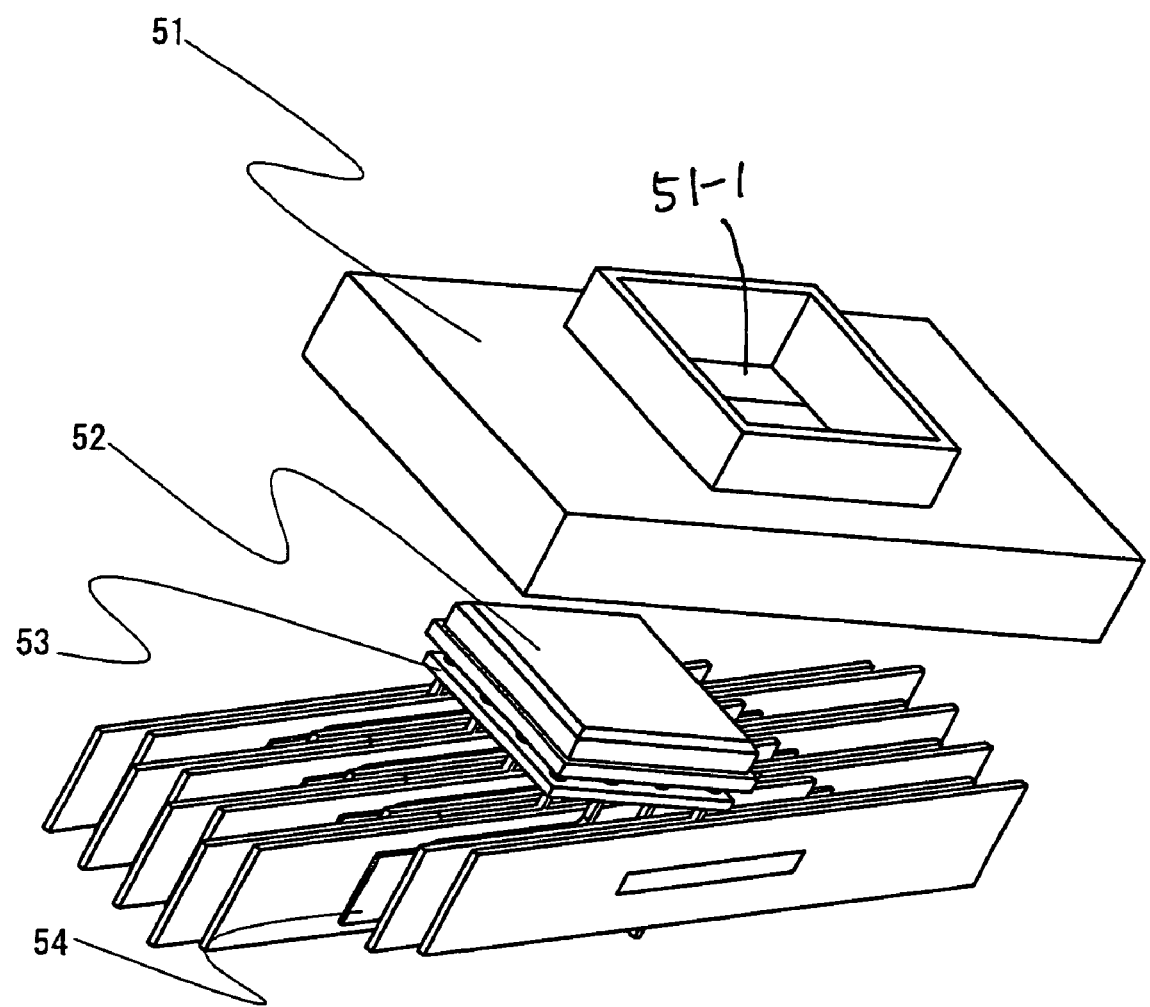
FIG. 11 is an exploded perspective view showing an electronic component depicted in FIG. 10.

FIGS. 10 to 15 illustrate a constitution and function of the second embodiment. FIG. 10 is a side view showing the second embodiment. A reference numeral 51 is a holder for fixing an electronic component 52 in which electric output terminals like a CSP (Chip Size Package) or a BGA (Ball Grid Array) are arranged in a lattice shape. Here, the electronic component 52 corresponds to the electronic device 18 to be tested of the first embodiment. FIG. 11 is an exploded perspective view of FIG. 10. As shown in FIG. 11, the holder 51 is formed with an opening 51-1 in which the electronic component 52 is fitted. The anisotropic polymer 53 is disposed under the electronic component 52, and the contact assembly is disposed under the anisotropic polymer 53.

Figure 12:
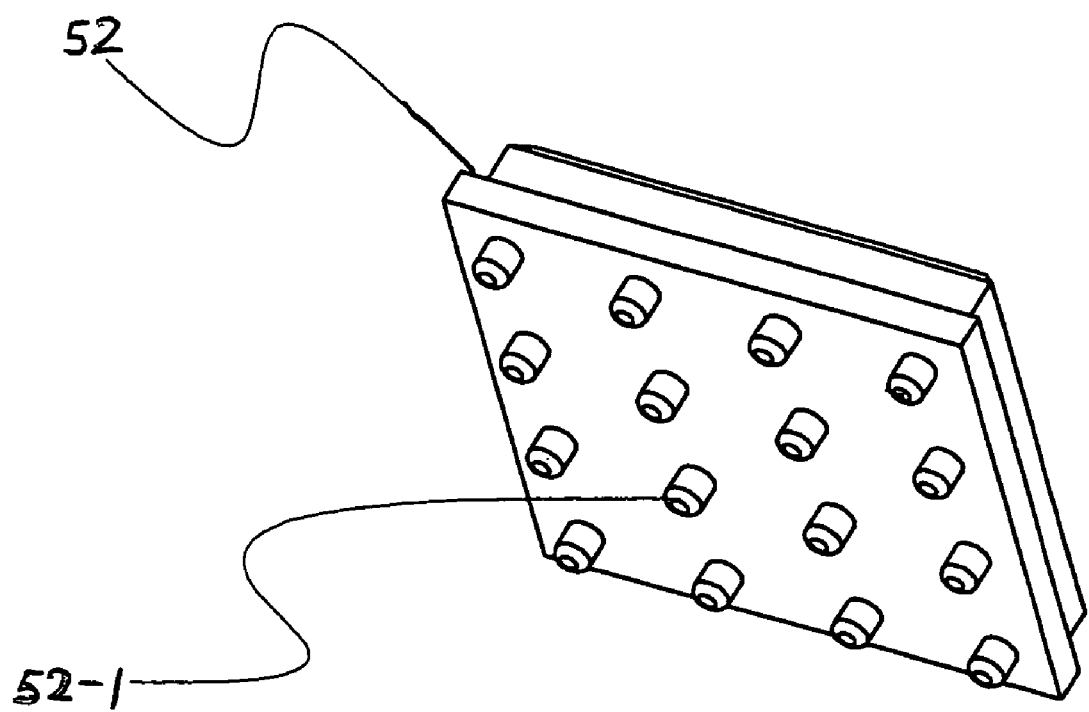
FIG. 12 is a perspective view showing arrangement of electric output terminals of an electronic component in accordance with the second embodiment.
Figure 13:
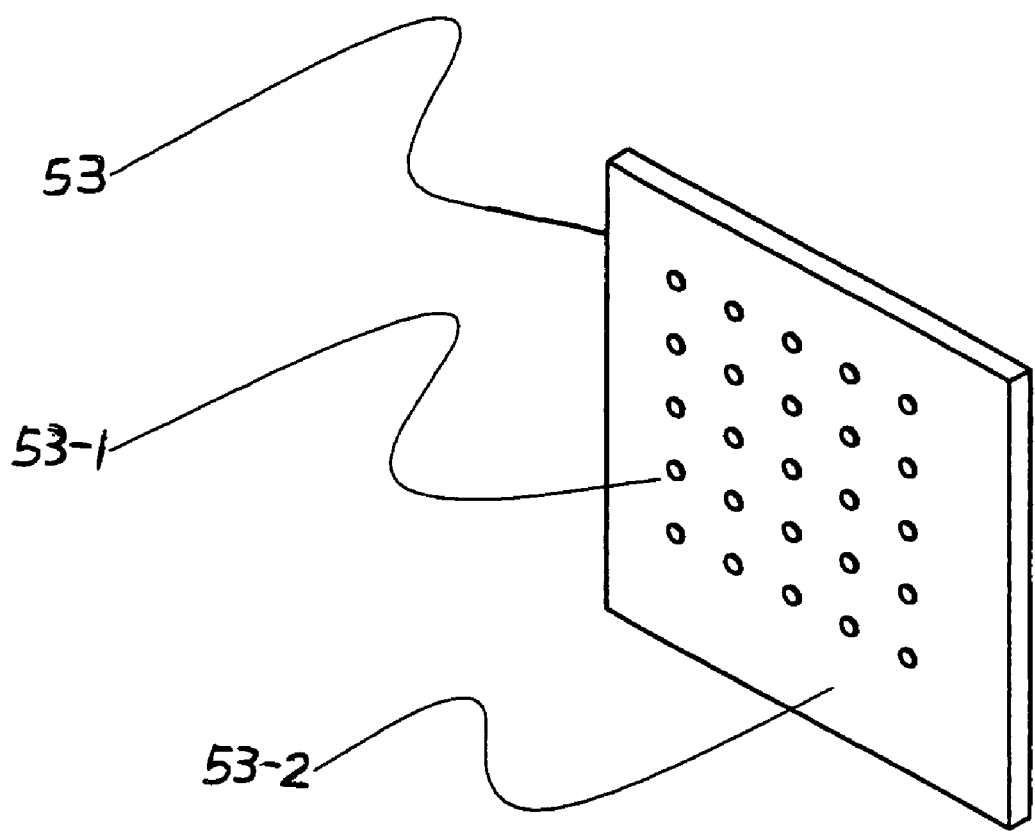
FIG. 13 is a perspective view showing an anisotropic polymer which is used in an electronic component in accordance with the second embodiment.

FIG. 12 is perspective view showing arrangement of electric output terminals of the electronic component, which is seen from the bottom. FIG. 13 is perspective view showing an example of the anisotropic polymer. The anisotropic polymer 53 includes a rectangular main body 53-2 which is made from a nonconductive material, and plural conductive lines which are inserted within the main body 53-2 in front and rear directions. Thus, when the electric output terminals get contact with either the front surface or the rear surface of the anisotropic polymer 53, electricity flows to the surface opposite thereto. When the input terminals of the probes directly contact the electric output terminals 52-1 of the electronic component 52, if the contact portion of the electric output terminals 52-1 has a ball shape, a slip happens. To prevent this problem, the anisotropic polymer 53 is interposed between the electronic component 52 and the contact assembly. The anisotropic polymer 53 may be provided by using a product manufactured by Shin-Etsu Chemical Co., Ltd.

Figure 14:
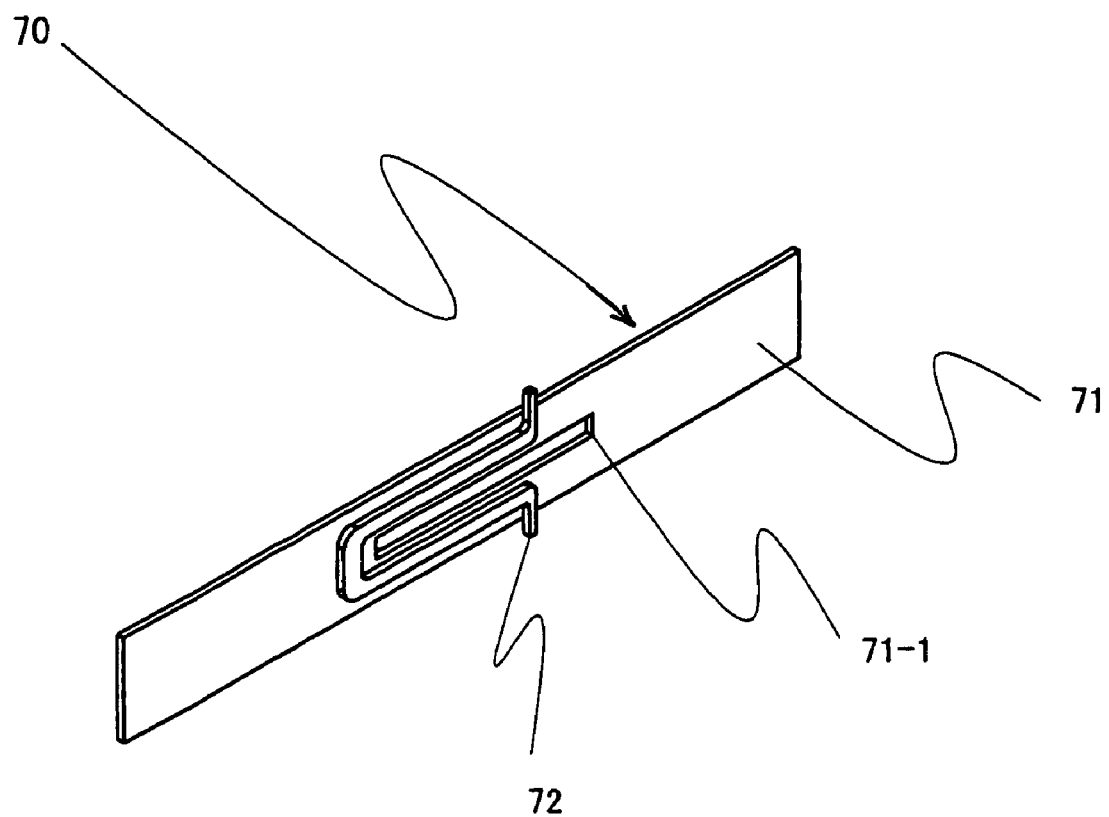
FIG. 14 is a perspective view showing a probe assembly including a resin film and a probe adhered to each other in accordance with the second embodiment.
Figure 15:
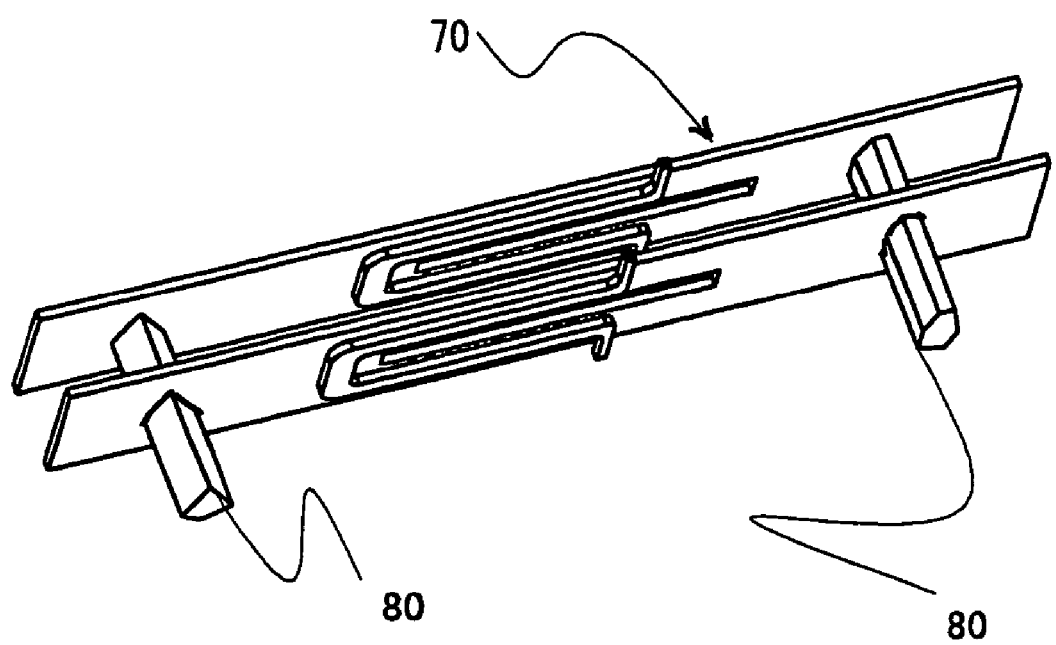
FIG. 15 is a perspective view showing two adjacent probe assemblies fixed to each other by bonding members in accordance with the second embodiment.

FIG. 14 is a perspective view showing a probe assembly of the second embodiment. As shown in FIG. 14, a probe assembly 70 is formed by coupling a resin film 71 and the probe 72. FIG. 15 is a perspective view showing a coupling structure of the plural probe assemblies depicted in FIG. 14. As shown in FIG. 15, the plural probe assemblies 70 are arranged in parallel in a width direction. A reference numeral 80 is a bonding member which is made from a polymer organic material (an adhesive agent). The probe assemblies 70 are connected to each other by the bonding members 80 while a gap to be required between two adjacent probe assemblies 70 is determined. Accordingly, the electric output terminals 52-1 of the electronic component 52 are connected to the input terminals of the probes 72 through the anisotropic polymer 53. The electric connection with the external wires or the like is same as the first embodiment.

According to the second embodiment, the contact assembly is configured such that the coupling rods passing through the resin films 71 are eliminated.

Third Embodiment

A third embodiment of the present invention will now be described. The prior art has a difficulty in using an inspecting device like the common-use external tester located apart from a probe card, contacting the electrical contacts to plural electrodes of the chip mounted on the wafer, and electrically communicating with the inspection circuit by simultaneously contacting the contacts to the terminals of the wafer chip. This is because there is not enough space to make the multi-layered boards in the probe card correspond to the plural wires. Further, the common-use external tester on the market is very expensive. Accordingly, it is an object of the third embodiment to solve the problem of requiring a broad wiring space due to the relatively cheap personal computer and memory-equipped computer.

The programmable system of the CPLD or FPGA receives signals from the external tester, and communicates with a signal composition circuit 78. As such, the third embodiment solves the problem of providing the multi-layered boards and arranging a lot of wires.

When the programmable electronic device provided with the terminals along its rectangular periphery is used as the signal composition circuit, because the programmable electronic device is larger than the chip on the wafer, an arranging angle of the programmable electronic device and the wafer should be considered, especially, without disposing the memory-equipped computer on the same plane with the programmable electronic device.

Figure 16:
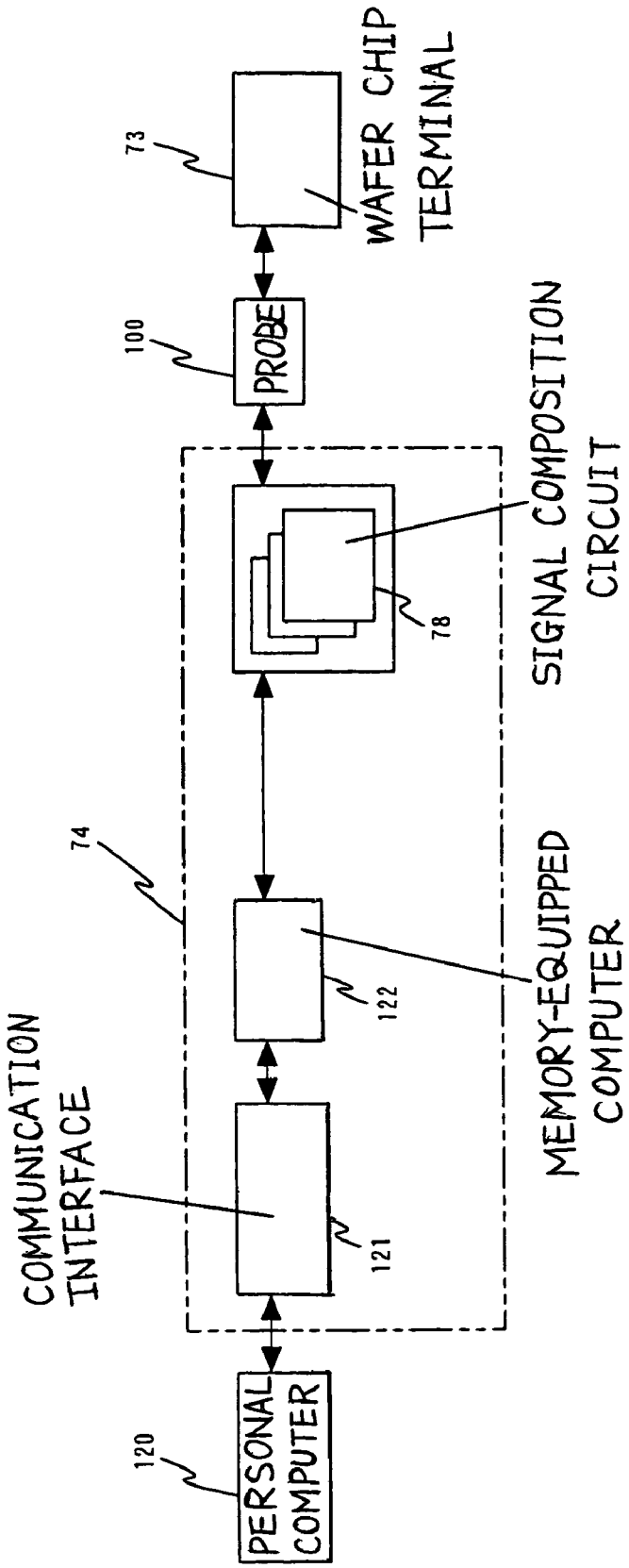
FIG. 16 is a block diagram showing a control system of a probe device in accordance with a third embodiment of the present invention.

FIG. 16 is a block diagram showing a construction of a system of an electric function inspecting device according to the third embodiment of the present invention. A system of an electric function inspecting device is provided with a memory-equipped computer at a wiring board, in order that plural wires are not needed and an inspection process can be performed at high speed. In FIG. 16, a reference numeral 120 means a common-use computer, e.g., a personal computer. A reference numeral 74 means a probe card equipped with a circuit, which is indicated by a chain double-dashed line in FIG. 16. The probe card 74 equipped with the circuit includes a communication interface 121 connected to the common-use computer 120, a memory-equipped computer 122 connected to the communication interface 121, and a signal composition circuit 78 connected to the memory-equipped computer 122.

The signal composition circuit 78 corresponds to the electronic device 18 to be tested which has relatively small number of input/output terminals (see FIG. 6), and the programmable electronic device 18-1 which has relatively large number of input/output terminals (see FIG. 8). The signal composition circuit 78 may be provided in plural, and may operate respectively corresponding to tests having different purposes. A reference numeral 73 is a wafer chip terminal. A probe 100 is interposed between the signal composition circuit 78 of the probe card 74 equipped with the circuit and the wafer chip terminal 73, to electrically connect them to each other. Inspection information of each wafer is transmitted to the communication interface 121 from the common-use computer 120, and then transmitted to the memory-equipped computer 122 through the communication interface 121. The memory-equipped computer 122 transmits/receives the test contents and results to/from the signal composition circuit 78. The signal composition circuit 78 generates an inspection signal corresponding to the wafer chip terminal 73, and transmits/receives a signal necessary for the inspection to/from the wafer chip terminal 73. Also, the signal composition circuit 78 receives the information of the inspection test from the wafer chip terminal 73, and transmits the information to the memory-equipped computer 122. The memory-equipped computer 122 transmits/receives the information to/from the common-use computer 120 through the communication interface 121.

The signal composition circuit 78 is provided in plural, and the plural signal composition circuits 78 are arranged along a side of the rectangle-arranged electrodes (the pads) of the wafer chip terminal 73. For example, when two hundred electrodes are arranged in a zigzag along a side of the wafer chip terminal 73, two signal composition circuits 78 are provided corresponding thereto. A hundred wires from the terminal of one of the signal composition circuits 78 are connected to the electrodes of the wafer chip terminal 73, which are located at every odd number position. In addition, a hundred wires from the terminal of the other signal composition circuits 78 are connected to the electrodes of the wafer chip terminal 73, which are located at every even number position. In the same manner, when arranging eight signal composition circuits 78 along four sides of the rectangle-arranged electrodes of the wafer chip terminal 73, eight signal composition circuits 78 correspond to eight hundred electrodes of the wafer chip terminal 73. It is described in this embodiment that the electrodes of the wafer chip terminal 73 are arranged in a rectangular shape, however, this is not limited thereto. The electrodes of the wafer chip terminal 73 may be arranged in a line shape, and one signal composition circuit 78 may be provided to correspond to the electrodes of the wafer chip terminal 73.

Figure 17:
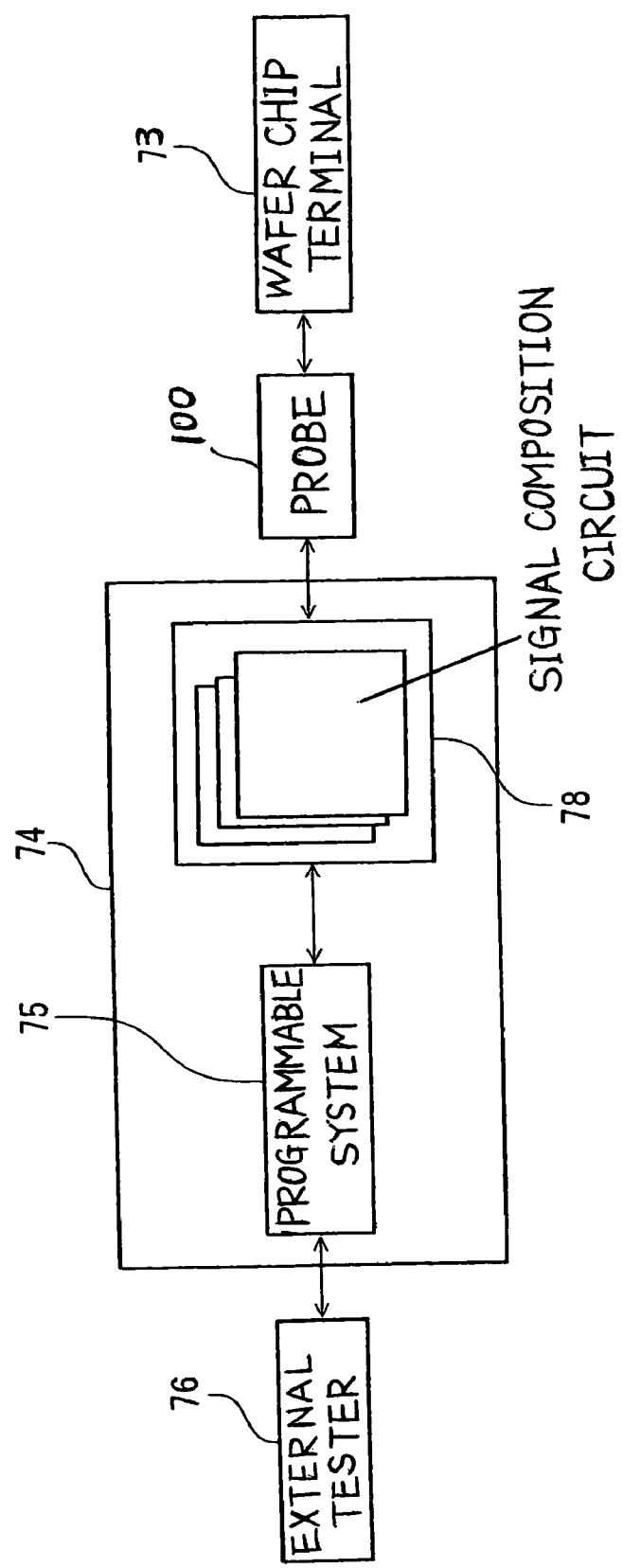
FIG. 17 is a block diagram showing a system constitution of an electric function inspecting device in accordance with a modified example of the third embodiment.

FIG. 17 is a block diagram showing a modified example of a system of the electric function inspecting device according to third embodiment. The system of the electric function inspecting device transmits/receives a signal to/from an external tester located outside the board, and is configured to cope with the high-speed inspection process without need of a lot of wires. As shown in FIG. 17, the system of the electric function inspecting device includes a signal composition circuit 78 of a probe card 74, a wafer chip terminal 73, a probe 100, a programmable system 75, and an external tester 76. The constitution and function of the signal composition circuit 78 of the probe card 74, the wafer chip terminal 73 and the probe 100 are same as those depicted in FIG. 16. The external tester 76 is an LSI tester which is on the market. The external tester 76 is connected to several hundred or more signal lines, and generates signals for inspecting the chips on one or more wafer. However, it is thought that it is difficult to simultaneously inspect all the chips on the plural wafers because there is a space limitation in the probe card 74 equipped with the circuit when being connected to the terminals on the plural wafers.

The programmable system 75 is a multi-functional system capable of processing a signal. The programmable system 75 includes the CPLD or FPGA as a main device, and has a serial/parallel conversion function and a boundary scan function. When initially setting or changing an inspection processing content, the programmable system 75 processes the content in a short time according to an order from the common-use computer 120. Accordingly, the programmable system 75 processes the signal from the external tester 76, so that the programmable system 75 can transmit/receive the signal to/from the signal composition circuit 78 through only the wires which can be arranged in the confined wiring space of the probe card 74.

Figure 18:
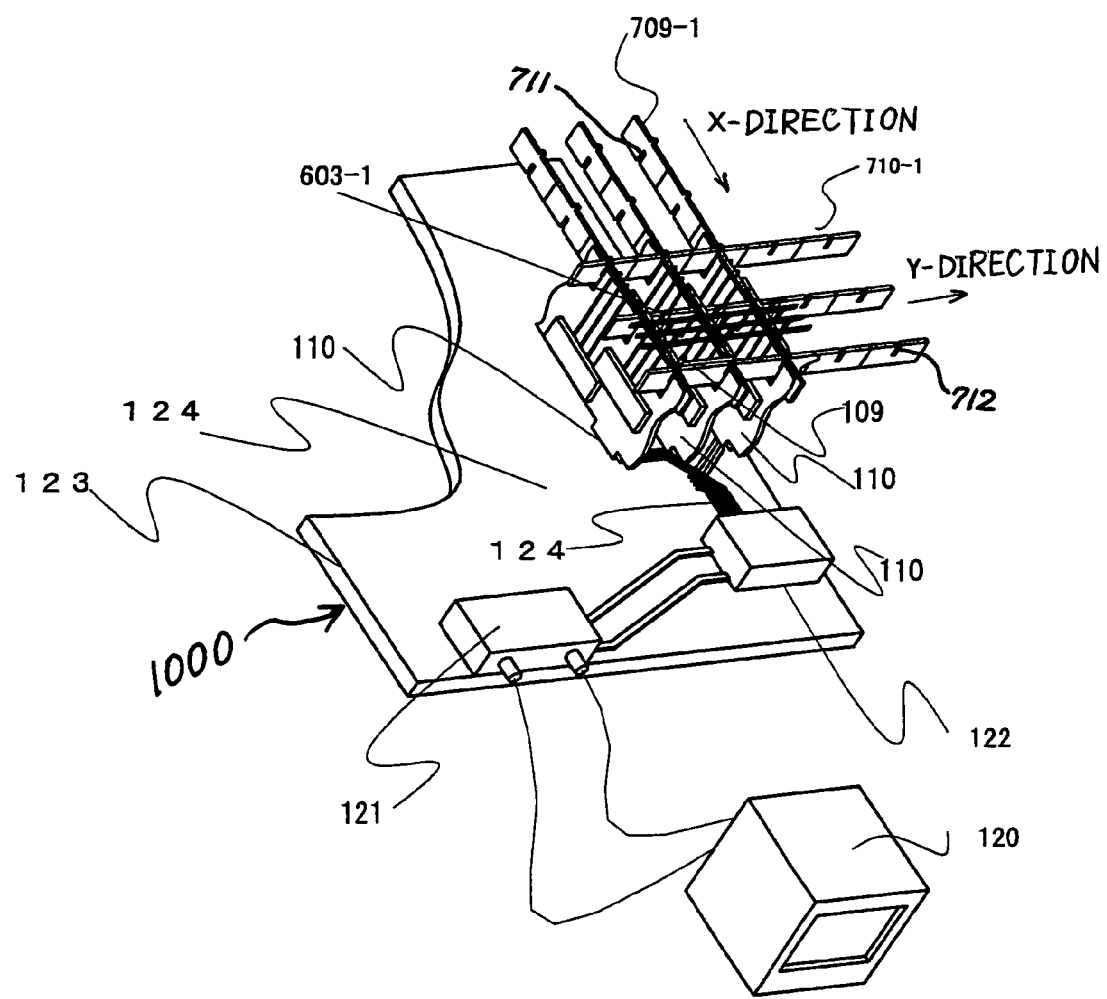
FIG. 18 is a perspective view showing a part of a contact assembly in accordance with the third embodiment.

FIG. 18 is a perspective view showing a construction of an LSI chip inspecting device in accordance with the third embodiment. An LSI chip inspecting device 1000 performs a high-speed inspection by simultaneously contacting the plural probes to the plural pads which are arranged in a line shape, for example.

Figure 19:
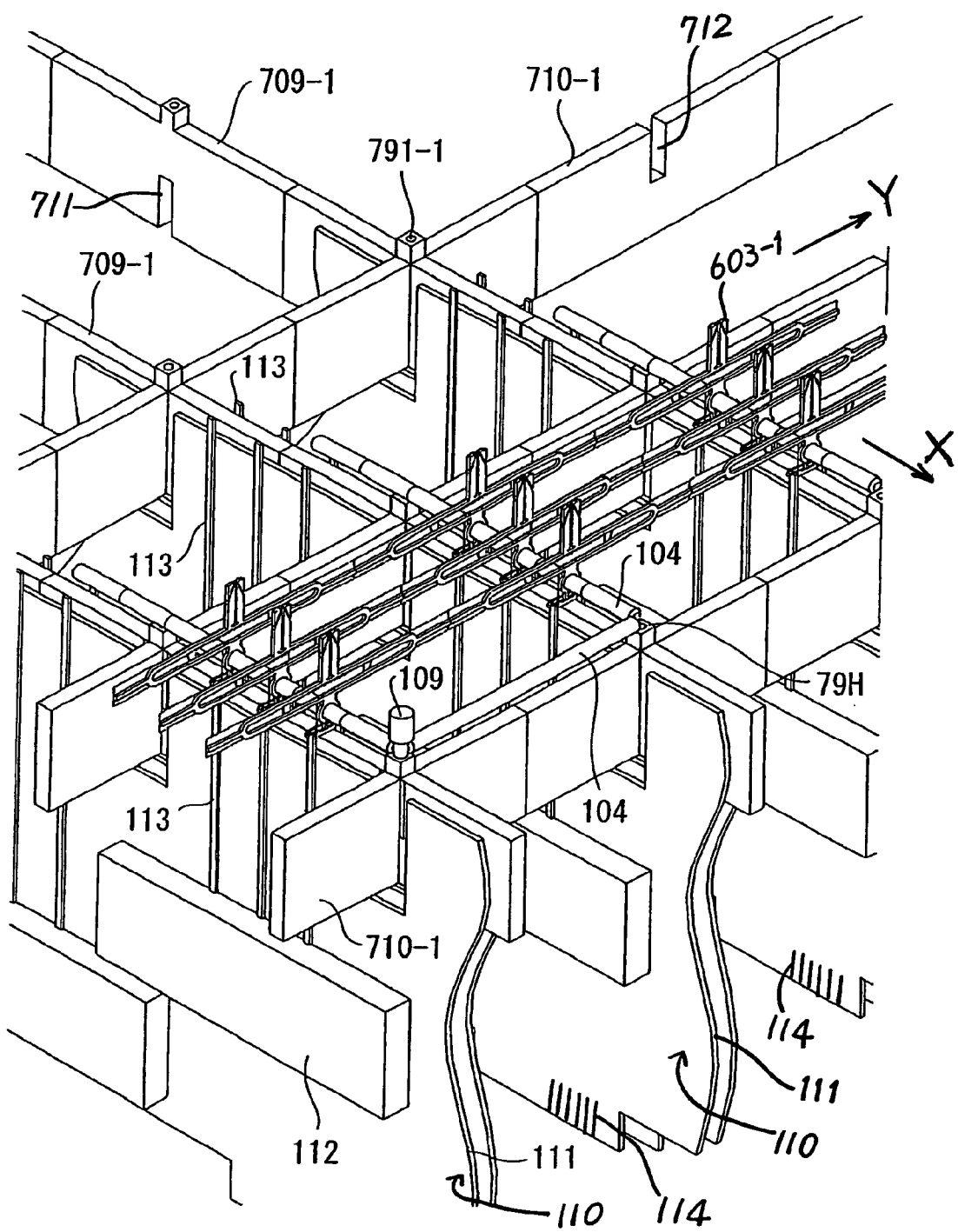
FIG. 19 is an enlarged perspective view showing an essential part of a contact assembly in accordance with the third embodiment.

In FIG. 18, a reference numeral 709-1 is a position determining member in an X-direction, and 710-1 is a position determining member in a Y-direction. The position determining members 709-1 and 710-1 have substantially same shapes and functions. However, as shown in FIGS. 18 and 19, the position determining member 709-1 in the X-direction is formed with first coupling slits 711, which are opened downward. On the other hand, the position determining member 710-1 in the Y-direction is formed with second coupling slits 712, which are opened upward. The position determining member 709-1 in the X-direction and the position determining member 710-1 in the Y-direction are provided in plural, and then the position determining members 709-1 are put on the position determining member 710-1 while the positions of the first coupling slits 711 coincide with the positions of the second coupling slits 712. As a result, the plural position determining members 709-1 and 710-1 are coupled to each other, to form a lattice-shaped position determining framework as a whole. The assembly of the position determining members 709-1 and 710-1 performs a function of achieving the accurate and stable position determination.

Plural probes 603-1 are mounted on the position determining members 709-1 and 710-1. The probes 603 are arranged in the Y-direction, and connected by ribbon-shaped films. By arranging the ribbon-shaped films in the thickness direction (in the X-direction) parallel to each other, the probes 603-1 are also spaced apart parallel to each other. In practice, grand line patterns and electric conducting parts are formed at the insulating films 3 by a manufacturing method like etching or plating based upon a lithography technique. A reference numeral 110 is a 1-axis test circuit, 120 is a common-use computer, 121 is a communication interface, 122 is a memory-equipped computer, 123 is a wiring board, and 124 is a wire on the wiring board 123.

Figure 20:
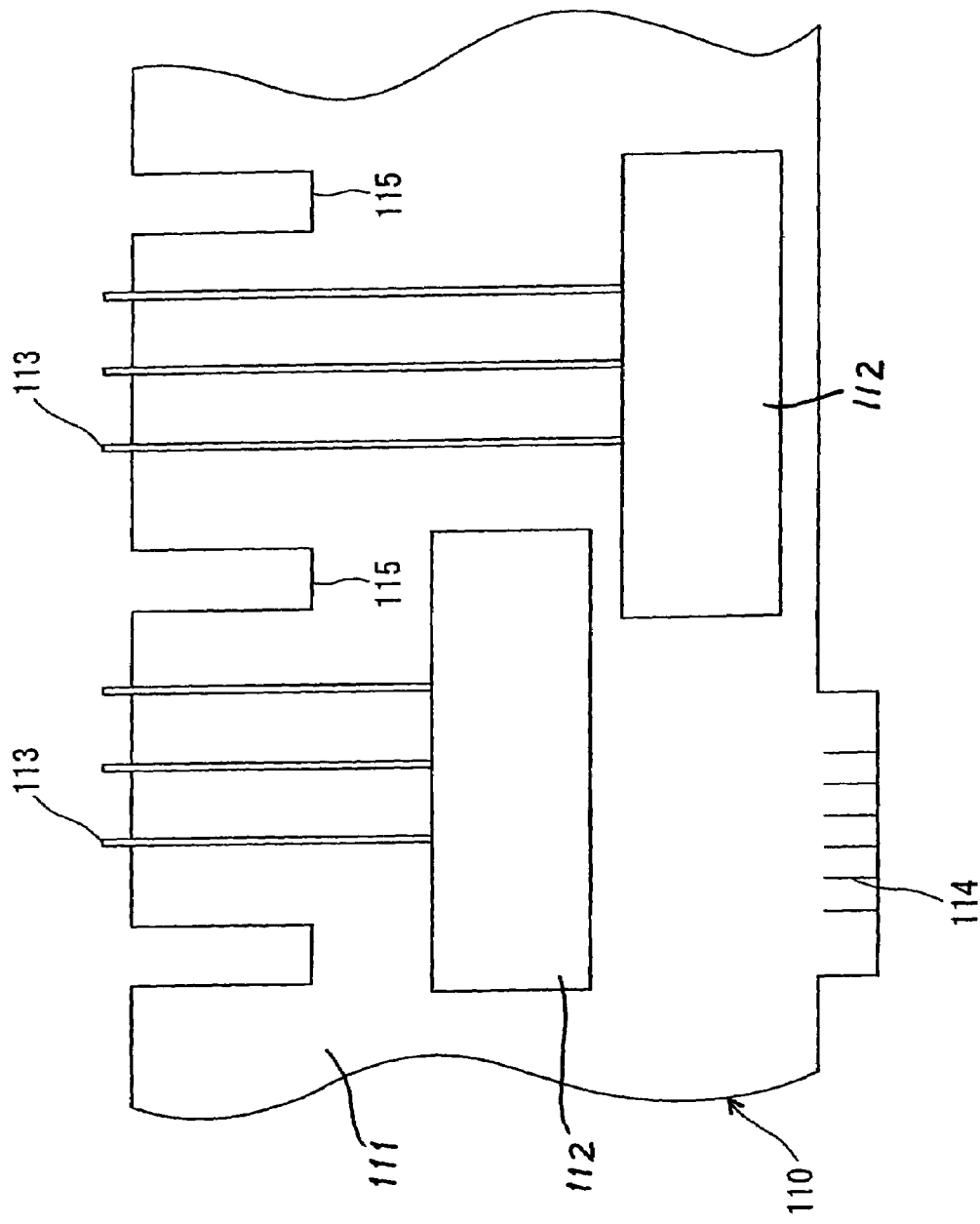
FIG. 20 is a front view showing a test circuit for 1-axis test in accordance with the third embodiment.

FIG. 19 is an enlarged perspective view showing an essential part of the LSI chip inspecting device 1000 depicted in FIG. 18. In FIG. 19, a reference numeral 110 is a 1-axis test circuit, which corresponds to the signal composition circuit 78 depicted in FIG. 16. The 1-axis test circuit 110 is provided in plural, and a pair of 1-axis test circuits 110 is fixedly attached to both surfaces of each of the position determining members 709-1 in the X-direction. FIG. 20 is a front view showing the 1-axis test circuit. The 1-axis test circuit 110 includes a flexible film 111, signal composition circuits 112, connecting wires 113, and input/output lines 114. The flexible film 111 is formed with cut portions 115 near terminals of the connecting wires 113. The cut portions 115 prevent the 1-axis test circuit 110 from interfering with the position determining members 710-1 in the Y-direction.

The flexible film 111 is made from the same material as the ribbon-shaped film 3 of the first embodiment, and the connecting wires 113 have the same function of electric connection with the probes as the circuit wires 21. The signal composition circuit 112 receives the inspection information from the common-use computer 120 (see FIG. 16) through the communication interface 121, and transmits the information to the connecting wires 113 from an interface 75. Since the signal composition circuits 112 can ensure spaces necessary in upper and lower directions, the inspection circuit can be arranged to correspond to the chips one by one. It is shown in FIG. 20 that the connecting wires 113 extend from two signal composition circuits 112 and are connected to the chip pads 10. However, in practice, the connecting wires extending from one of the plural signal composition circuits 112 are connected to the pad 10 on one chip via the connecting wires 113.

Figure 21:
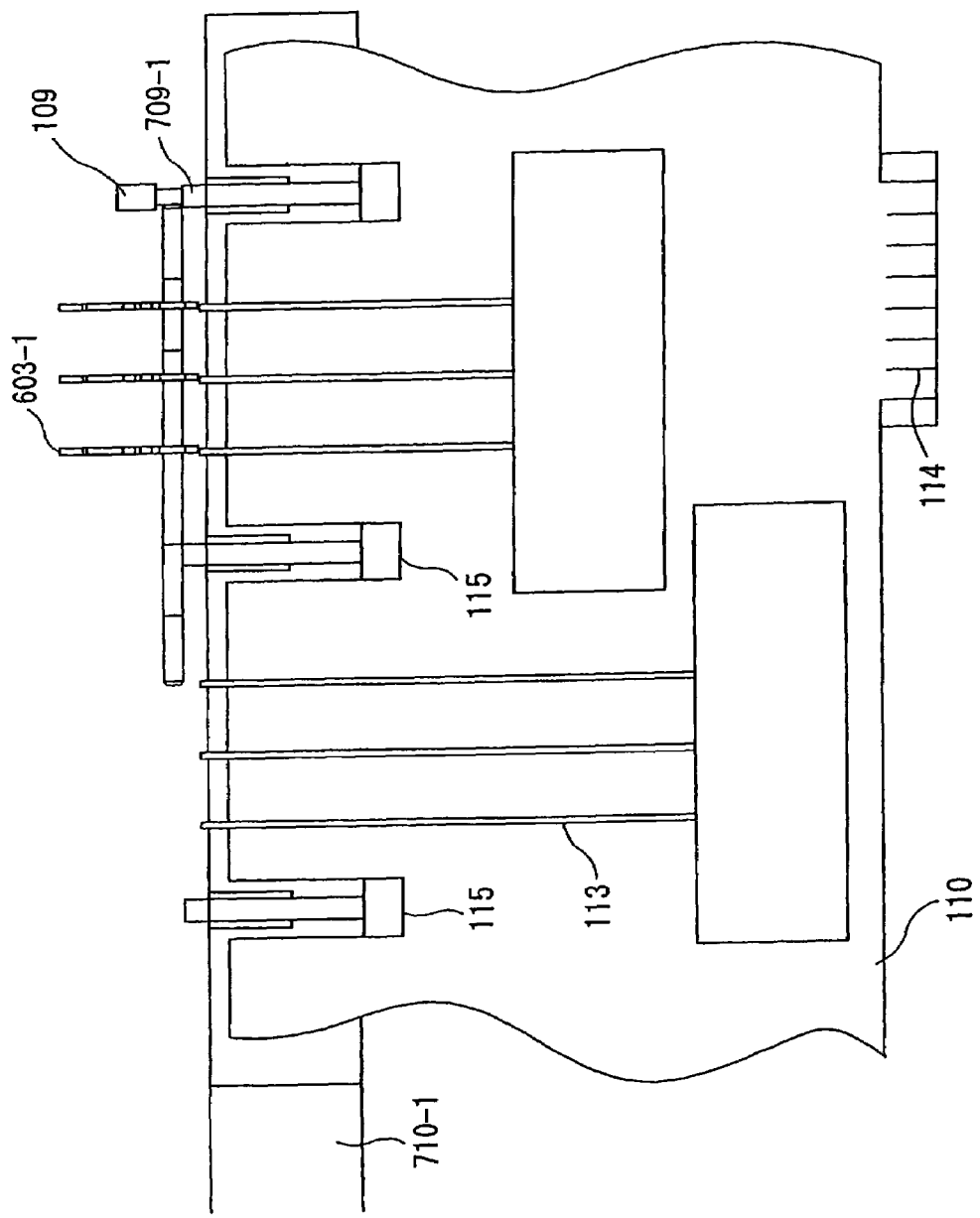
FIG. 21 is a view showing a contact assembly which is seen from an arrow Y direction depicted in FIG. 18.
Figure 22:
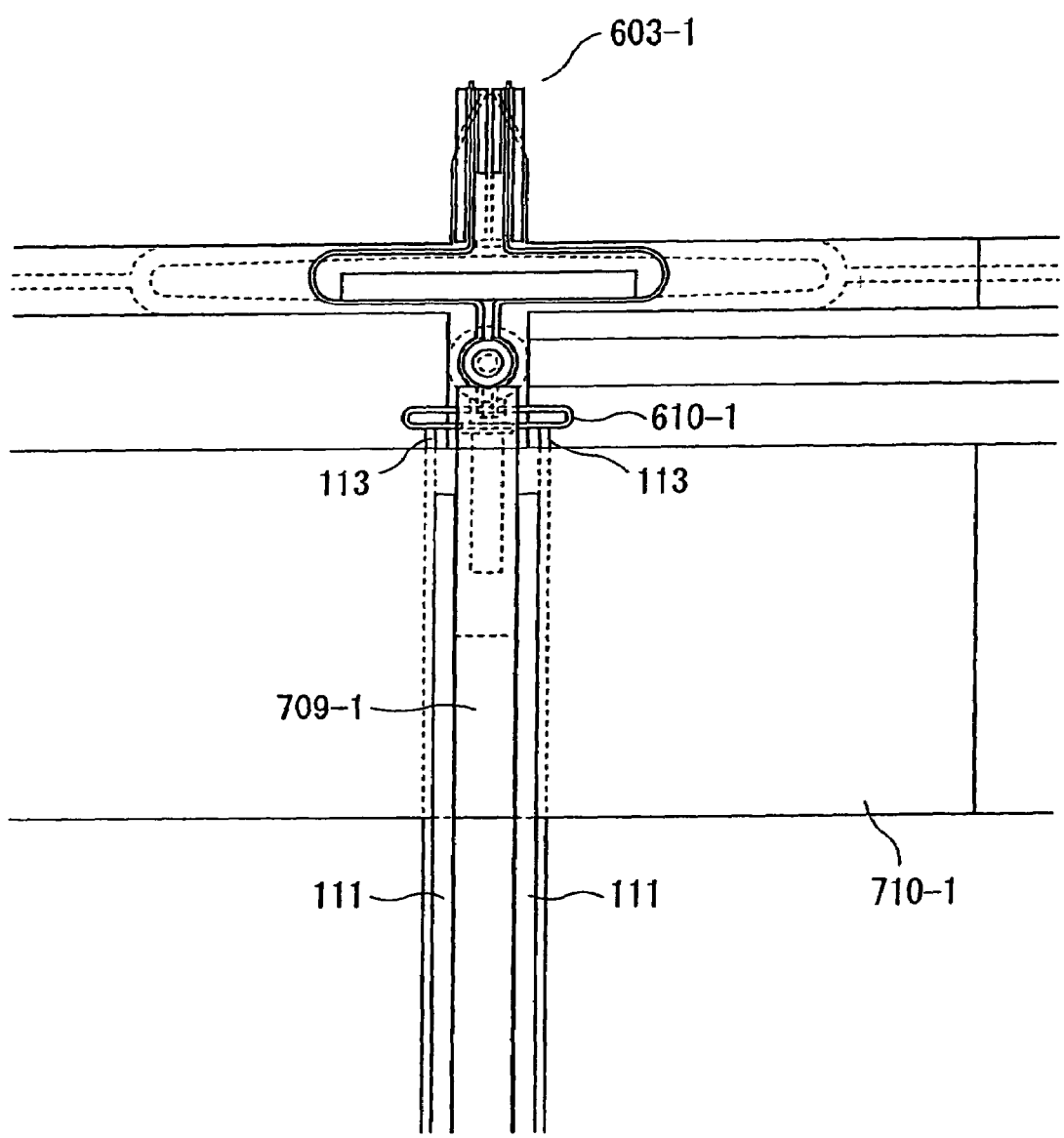
FIG. 22 is a view showing a contact assembly which is seen from an arrow X direction depicted in FIG. 18.

FIG. 21 is a view which is seen from an arrow Y direction shown in FIG. 18. FIG. 22 is a view which is seen from an arrow X direction shown in FIG. 18. As shown in FIGS. 19 and 21, the position determining members 709-1 in the X-direction are formed with holes 791-1 at top sides, into which fixing pins 109 are fitted. Cylindrical bars 104 are disposed along the top sides of the position determining members 709-1 and 710-1 in the X-direction and Y-direction. Ends of the cylindrical bars 104 are fixed by being fitted between the fixing pins 109 and protruding portions of the position determining members 709-1 and 710-1. As shown in FIG. 22, the connecting wires 113 protrude a little from the flexible film 111 and contact a deformable output part 610-1, to thereby achieve an electric connection. The cut portions 115 formed at the 1-axis test circuit 110 prevent the 1-axis test circuit 110 from interfering with the position determining members 709-1 in the X-direction.

In the third embodiment, the wiring board 123 is located on the different plane from the signal composition circuits 112, and arranged perpendicular to the flexible film 111 to which the signal composition circuits 112 are attached. Accordingly, the size of the planar surface and the number of the electronic devices are determined by adjusting a height (the direction perpendicular to the wiring board 123) of the flexible film 111.

Fourth Embodiment

A fourth embodiment of the present invention will now be described with reference to the annexed drawings. The fourth embodiment is advantageous over the third embodiment when making more contacts correspond to the wafer chip terminals. The system has the same constitution as that shown in FIG. 16. In the case that the number of the wafer chip terminals is increased and the electronic device like the CPLD or FPGA including the lattice-arranged output terminals is used as the signal composition circuit, the fourth embodiment is effective.

Figure 23:
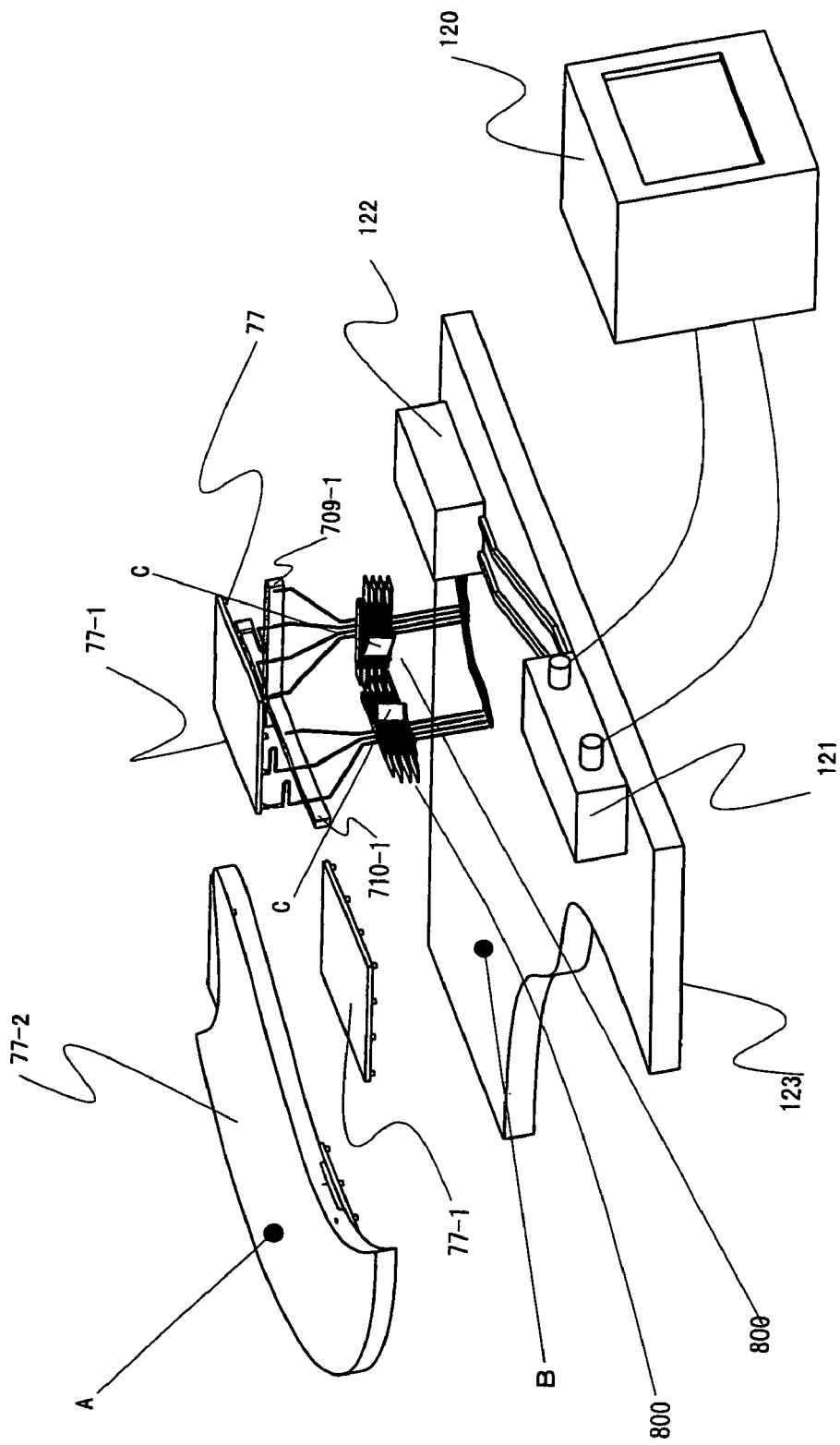
FIG. 23 is a perspective view showing an overall constitution of an inspecting system for a contact assembly in accordance with a fourth embodiment of the present invention.

FIG. 23 is a perspective view showing a constitution of the fourth embodiment. In FIG. 23, a reference numeral 120 is a common-use computer, 121 is a communication interface, 122 is a memory-equipped computer, 123 is a wiring board, and 124 is a wire on the wiring board 123. A reference numeral 800 is a contact assembly, which has the same constitution as the contact assembly according to the first embodiment or the second embodiment. A reference numeral 709-1 is a position determining member in an X-direction, and 710-1 is a position determining member in a Y-direction, which are the same components as those described in the third embodiment. The position determining members 709-1 and 710-1 have substantially same shapes and functions. A reference numeral 77 is a wafer chip terminal, and a probe has a function of retaining the contacting force with the wafer chip terminal 77.

A reference numeral 77-1 is a chip which has plural wafer chip terminals 77. A reference numeral 77-2 is a wafer for retaining the chips 77-1. The chip 77-1 is provided in plural as a part of the wafer 77-2. In FIG. 23, the chips 77-1 are disposed under the wafer 77-2.

A connecting structure to connect the memory-equipped computer 122 to the signal composition circuit 112 is same as that of the third embodiment.

A surface A of the wafer 77-2 is parallel with a surface B of the wiring board 123. A surface C of the programmable device on the signal composition circuit 122 is perpendicular to the surface A of the wafer 77-2.

According to the fourth embodiment, the wafer inspecting system is constructed to simultaneously inspect all the chip pads on the wafer at high speed, in such a manner that one inspecting circuit corresponds to one chip. Also, the purpose of the fourth embodiment can be achieved by using the electric connecting means of the first and second embodiments.

Fifth Embodiment

If considering a cost-effective use of the wafer inspecting system, it is preferable to use common-use products as the computer part and the electronic circuit part, and to change the probe assembly according to the arrangement shape of the chip pads. Such a purpose can be achieved by combining the programmable electronic device with a coordinate transformation circuit according to the fifth embodiment.

Particularly, the fifth embodiment provides a method capable of making the a probe 603-1 correspond to an LSI chip which has different size, position and pad arrangement, without changing a wiring board 123 and a signal composition circuit 78.

Figure 26:
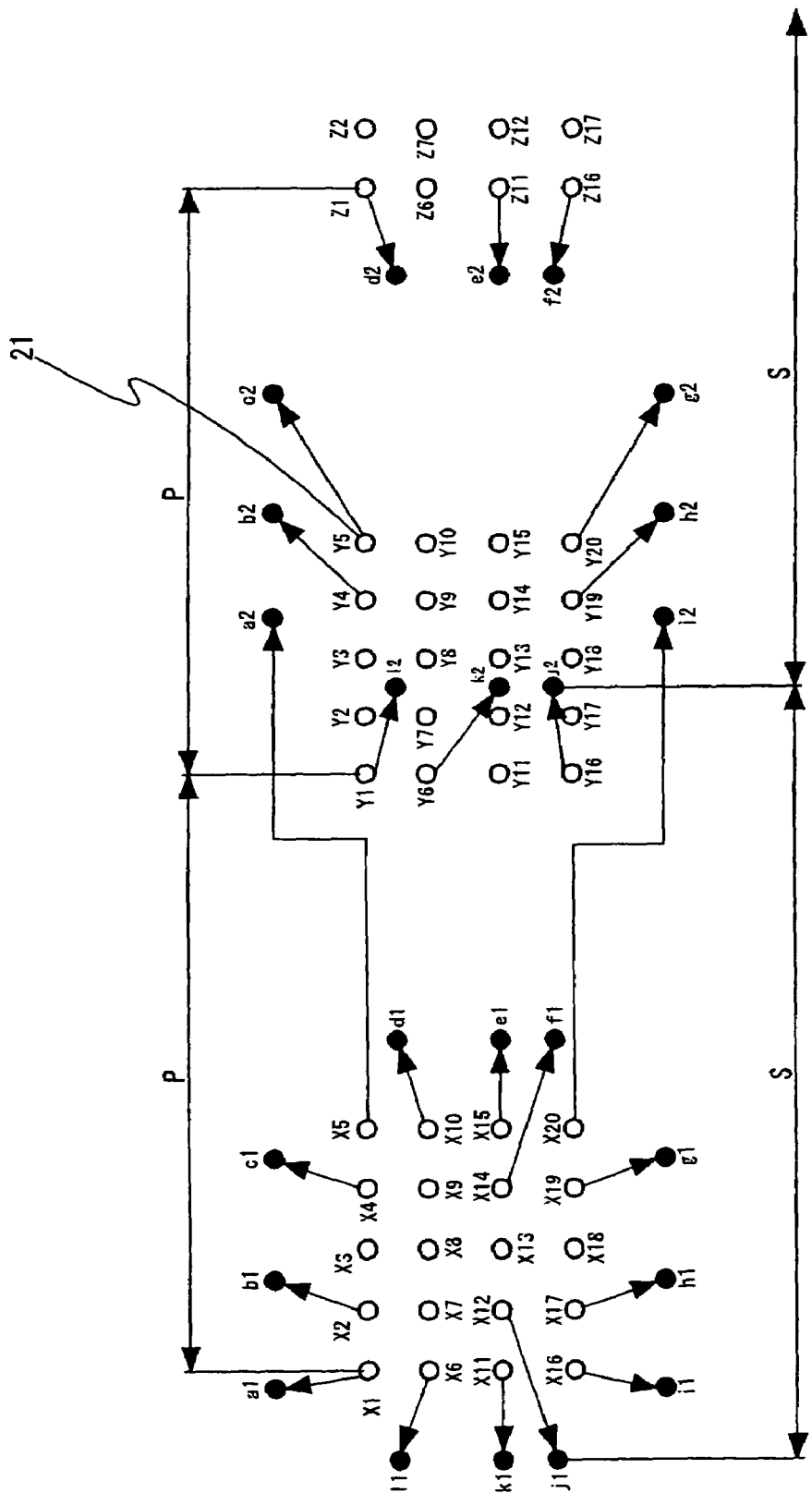
FIG. 26 is a schematic diagram showing an arrangement structure of wafer chip terminals (terminal position) in a specific wafer chip and a coordinate transformation process in a coordinate transformation circuit with respect to the wafer chip terminals in accordance with the fifth embodiment.

The fifth embodiment has a construction such that the structures (the signal composition circuits 78) in FIG. 8 (which is related to the modified example of the first embodiment) are arranged parallel, and circuit wires 21 are connected to a contact of the output part 610-1 in FIG. 22 through the coordinate transformation circuit in FIG. 26. The fifth embodiment has features of achieving an inspection although circuit wires (which function as input/output of one programmable electronic device 18-1) are connected to pad terminals of plural different chips.

Also, the fifth embodiment provides a method of simplifying the system by arranging plural 1-axis test circuits 110 in parallel to correspond to a chip like ASIC, on which pads are arranged in a rectangular shape without arranging the 1-axis test circuit 110 and the substantially same 1-axis test circuit 110 in a lattice shape.

Figure 24:
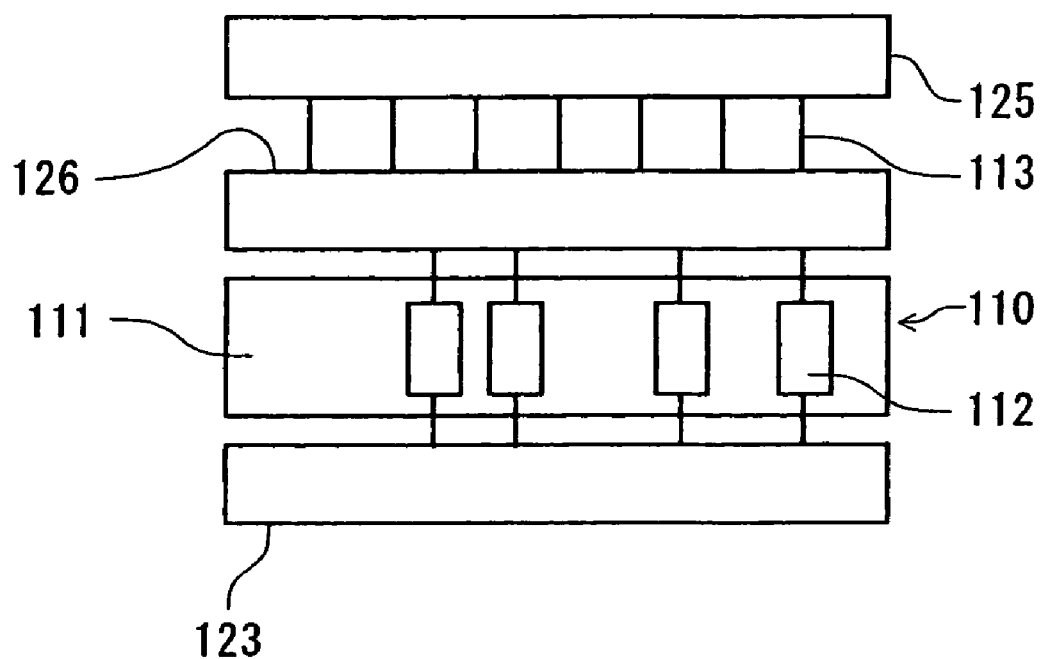
FIG. 24 is a front view schematically showing a system constitution of an electric signal inspecting device in accordance with a fifth embodiment of the present invention.

The fifth embodiment will now be described with reference to the annexed drawings. The fifth embodiment is advantageous when making contacts correspond to wafer chip terminals arranged in high density s in the third or fourth embodiment. FIG. 24 is a front view schematically showing a constitution of a system of an LSI chip inspecting device 1000 according to the fifth embodiment. In FIG. 24, a reference numeral 110 is a 1-axis test circuit, which is formed by attaching signal composition circuits 112 (or signal composition circuits 78) to a flexible film 111. The CPLD or FPGA is used as the signal composition circuit 112. An inner structure of the fifth embodiment is same as that of the modified example of the first embodiment.

A reference numeral 125 is a probe assembly for a circuit to be inspected. As shown in FIG. 22, the probe assembly 125 includes a probe 603-1, connecting wires 113 and flexible films 111. By connecting the connecting wires 113 to terminals a1, b1 . . . 11 and a2, b2 . . . 12 depicted in FIG. 26, electricity can flow to the probe 603-1 after the coordinate transformation.

A reference numeral 126 is a coordinate transformation circuit. The coordinate transformation circuit 126 is connectingly interposed between terminals of the circuit 125 to be inspected (the chip terminals 77) and terminals of 1-axis test circuit 110 (the terminals of the vertical type probes), and performs a coordinate transformation for compensating or changing a position misalignment therebetween. A reference numeral 123 is a wiring board, which is the same component as that of the third and fourth embodiments. As shown in FIG. 24, the probe assembly 125 and the coordinate transformation circuit 126 are combined in one unit, and can be mounted/demounted to/from the probe card 74 equipped with the circuit.

Figure 25:
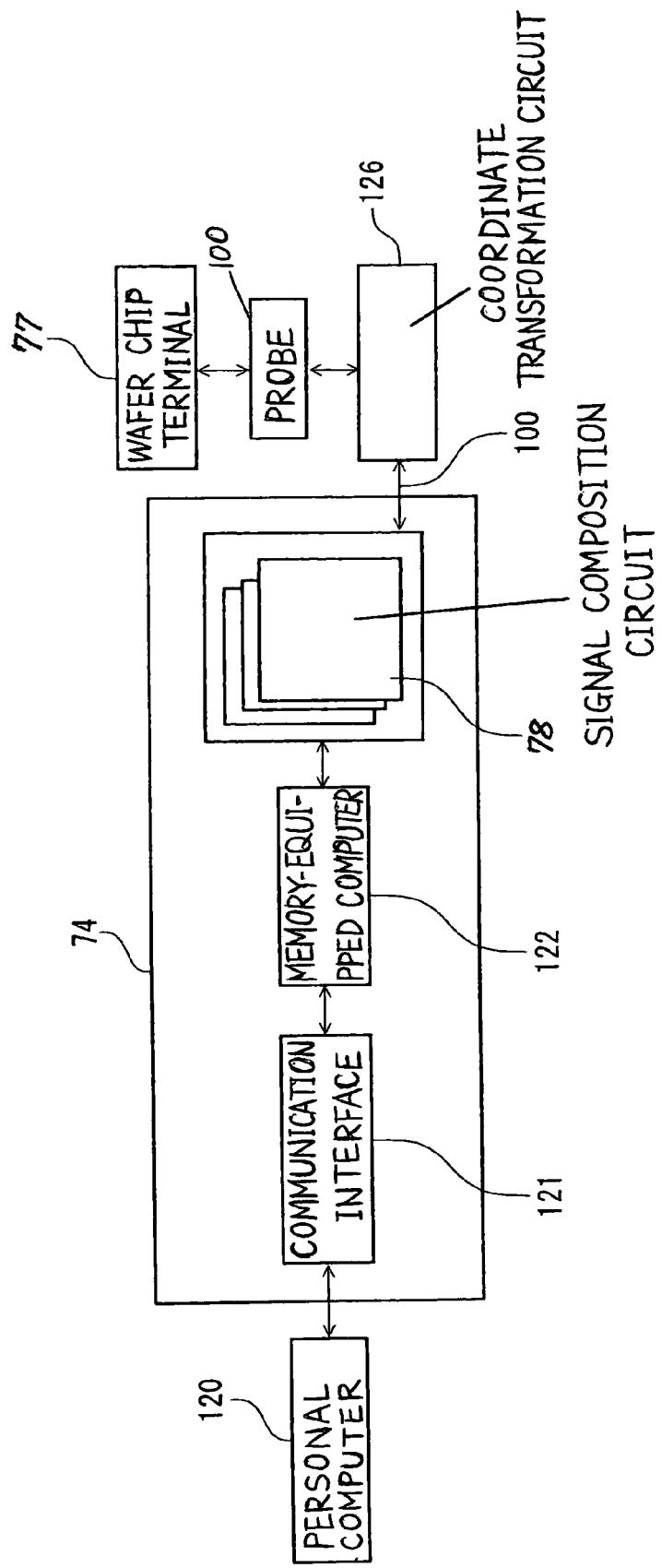
FIG. 25 is a block diagram showing a circuit constitution of a system of an LSI chip inspecting device in accordance with the fifth embodiment.

FIG. 25 is a block diagram showing a circuit constitution of the system of the LSI chip inspecting device 1000 according to the fifth embodiment. The circuit constitution of the system of the fifth embodiment is basically same as that shown in FIG. 16, except that the coordinate transformation circuit 126 is mounted between the probe card 74 equipped with the circuit and the wafer chip terminals 73.

Hereinafter, the operation of the LSI chip inspecting device 1000 according to the fifth embodiment constructed as above will now be described. In the case that the wafer chip is selected as the circuit to be inspected, it may happen that the arrangement structure of the wafer chip terminals 73 is different from that of the terminals of the LSI chip inspecting device 1000 (the signal composition circuit 78 or the signal composition circuit 112). In this case, when the circuit inspection of the wafer chip is performed, the coordinate transformation between the wafer chip and the probe card 74 is performed by the operation of the coordinate transformation circuit 126. And, the terminals of the signal composition circuit 78 are electrically connected to the wafer chip terminals 73, which are arranged in a rectangular shape, through the coordinate transformation circuit 126.

Figure 27:
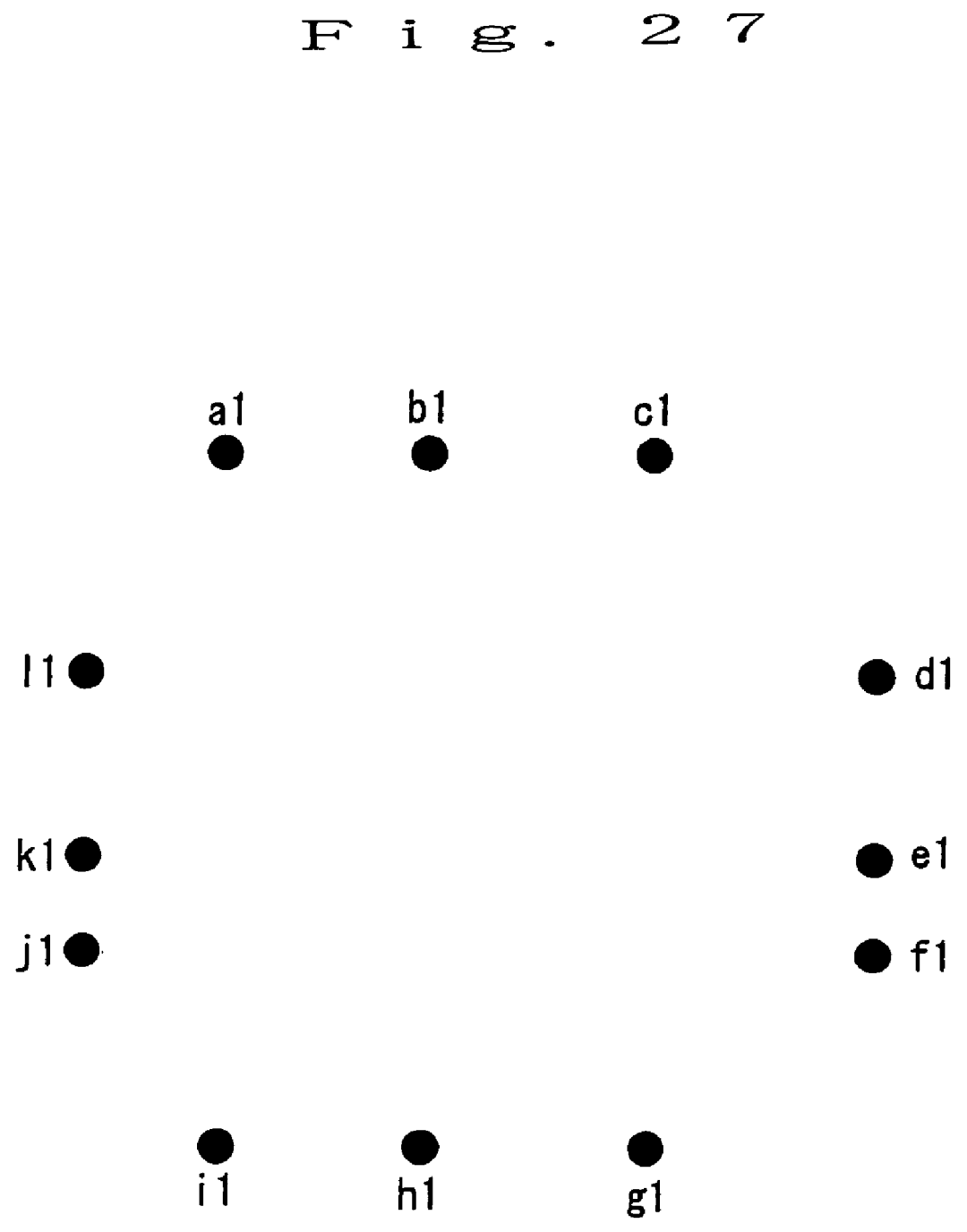

FIGS. 26 and 27 are schematic diagrams for showing the coordinate transformation operation of the coordinate transformation circuit. Particularly, FIG. 26 shows an arrangement structure of the wafer chip terminals 73 (terminal position) in a specific wafer chip and the coordinate transformation process with respect to the wafer chip terminals 73, and FIG. 27 shows the arrangement of wafer chip terminals 73 and signal arriving positions of the coordinate transformation circuit after the coordinate transformation process.

In FIG. 26, a mark means the position of the wafer chip terminals, which is indicated by a1, b1, c1 . . . The mark also means a target position where the signal arrives after the coordinate transformation. The position of the wafer chip terminals is divided into an A group and a B group. The A group includes a1, b1, c1, d1, e1, f1, g1, h1, i1, j1, k1 and l1, and the B group includes a2, b2, c2, d2, e2, f2, g2, h2, i2, j2, k2 and l2. The A group corresponds to a chip A, and the B group corresponds to a chip B. A gap between the A group and the B group in an X-direction is S mm. The arrangement in a Y-direction is omitted. The signal arrangements of the A group and the B group are totally the same or almost the same.

Similarly, the circuit wires for the output from the signal composition circuit 78 are illustrated as position coordinates in FIG. 26. A mark ○ means the wiring position of the signal composition circuit, which is indicated by X1, X2, X3 . . . The mark ○ also means a start point of the signal for the coordinate transformation. The wiring position of the signal composition circuit is divided into an group and a group. The group includes X1, X2, X3, X4, X5, X6, X7, X8, X9, X10, X11 and X12, and the group includes Y1, Y2, Y3, Y4, Y5, Y6, Y7, Y8, Y9, Y10, Y11 and Y12. A gap between the group and the group in the X-direction is P mm. The arrangement in the Y-direction is omitted. The wiring position of the signal composition circuit may further include a group. The group, the group and the group are wiring positions of the signal composition circuit, through which the signal is outputted from the plural CPLD having the same X-coordinates or the same Y-coordinates. Since the group is constituted by ○ of four rows, it is clearly seen that four programmable electronic devices 18-1 are provided.

Reference numerals Z1, Z2, Z6, Z11, Z12, Z16 and Z17 are parts of the group. The signal arrangements of the group, the group and the group are totally the same or almost the same.

There exists no specific relationship in the arrangements between the A and B groups and between the and groups. But, the arrangements between the A and B groups and between the, and groups are determined by the arrangement of the wafer chip terminals and the arrangement of the circuit wires 21 for the output from the signal composition circuit 78.

X1, X2, . . . X5, . . . Y1, Y2, . . . Y5, . . . Z1, Z2, . . . are positioned on the inspection circuit board 19 or the inspection circuit board 20. Also, X6, X7, . . . X10, . . . Y6, Y7, . . . Y10, . . . are positioned on the inspection circuit board 19 or the inspection circuit board 20.

When the LSI chip inspecting device is constituted by the probe assembly 125 corresponding to the wafer chip terminals, the standard 1-axis test circuit 110 and the wiring board 123, the arrangement shown in FIG. 26 is generally obtained. FIG. 26 shows the position of the circuit 21 and the wafer chip terminals schematically. In the case of such an arrangement of the ○ and, since the in the group X1 a1, X2 b1, X4 c1, . . . X16 i1, . . . X20 i2 is not connected with ○ in the other group, it is clearly seen that the coordinate transformation can be achieved by one programmable electronic device 18-1.

When the wiring arrangement is performed across the three groups like X5→a2, Y4→b2 . . . Z1→d2 . . . X20→12, the inspection of the wafer chip located on the second group is performed by the signals acquired from three programmable electronic devices 18-1.

(Explanation of the Possibility with the Programmable Electronic Device 18-1)

As described above, the circuit wires 21 of the programmable electronic device 18-1 can be allotted to the wafer chip terminals. This is satisfied by the condition that the number of ○ is larger than the number of. When designing in detail, it may be considered to construct multi-layer wires to avoid the contact at intersecting points of the wires.

The coordinate transformation with respect to each wafer chip may not be performed as shown in FIG. 26. FIG. 26 shows just one example of transforming the arrangement structure of the wafer chip into the rectangle-shaped arrangement. As seen from FIG. 27, the arrangement structure of the wafer chip is transformed into the rectangle-shaped arrangement through the coordinate transformation performance, and the test about the electric function or the inspection is performed.

According to the aforesaid third embodiment, when the signal composition circuit 112 provided with the terminals along its rectangular periphery is used as the signal composition circuit 78, because the signal composition circuit 112 is larger than the chip 77-1 on the wafer 77-2, the arranging angle of the signal composition circuit 112 and the wafer 77-2 should be considered, especially, without disposing the memory-equipped computer 122 on the same plane with the signal composition circuit 112. However, according to the fifth embodiment, because the coordinate transformation is performed by the coordinate transformation 126, the construction can be simplified without particularly considering the arranging angle of the signal composition circuit 112 and the wafer 77-2.

Sixth Embodiment

As described above, the present invention according to the aforesaid first to fifth embodiments has characteristics that the chip (LSI) as the circuit to be inspected is in state of being mounted on the wafer by the semiconductor manufacturing process and the plural chips can be simultaneously inspected. However, other inspecting methods of simultaneously inspecting the plural chips may be considered. For instance, the chips may be separated from the wafer individually or in groups, and the separated chips are arranged on a receiving plate (a tray or a test board) to be simultaneously inspected.

Figure 28:
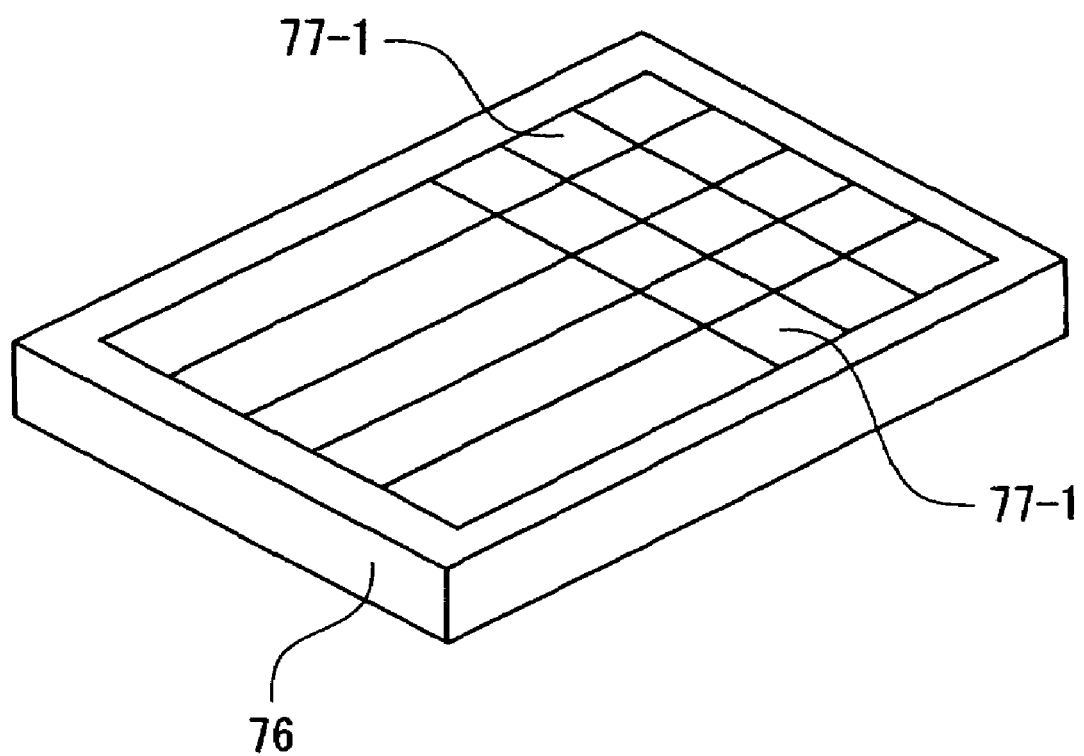
FIG. 28 is a perspective view showing a chip retaining structure for retaining chips to be inspected by an LSI chip inspecting device in accordance with a sixth embodiment of the present invention.
Figure 29:
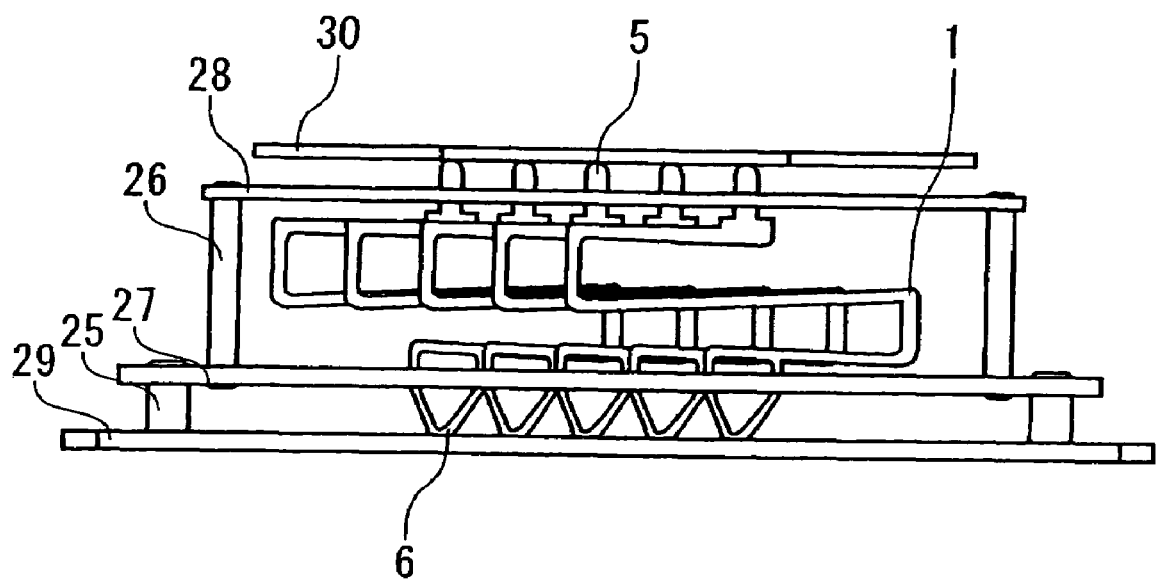
FIG. 29 is a front view showing a contact assembly retaining instrument of a prior art.

FIG. 28 is a perspective view showing a chip retaining structure having the test board on which the chips are loaded to be simultaneously inspected by the LSI chip inspecting device 1000. Conventionally, the chips to be tested are inserted into chip sockets formed at the test board, the wires from the chip tester are connected to the test board, and the chips are inspected in order. If terminal pins of the sockets formed at the test board function as the output terminals of the probe assembly, the simultaneous inspection of the chips is possible. In other words, by controlling a network, wherein the terminal pins of the sockets containing the chips to be tested are connected to the CPDL, by means of a personal computer or a work station, the plural chips to be tested which are loaded on the test board can be simultaneously inspected, thereby reducing the inspecting time. By inputting a test program including a test pattern and a control program defining an inspecting order to the personal computer or the like, the personal computer takes the place of the expensive chip tester, to thereby decrease the inspecting costs. Instead of replacing the chip tester with the personal computer, the test information including the test pattern may be inputted to the personal computer or the work station by means of the chip tester, so as to simultaneously inspect the chips to be tested by using the personal computer or the work station. So, the inspecting costs can be reduced while possessing the chip tester.

The coordinate transformation by using the coordinate transformation circuit according to the fifth embodiment can be applied to this embodiment of simultaneously inspecting the plural chips loaded on the test board. Accordingly, although the chips are disposed irregularly on the test board, the chips are recognized as if they are disposed regularly (e.g., the rectangle-shaped arrangement) on the test board by the coordinate transformation. Further, even if the chips become more compact (i.e., the integration density becomes higher) in the future and the position of the chip terminals is changed, the LSI chip inspecting device 1000 can perform the coordinate transformation corresponding thereto.

As apparent from the above description, the present invention provides a contact assembly and LSI chip inspecting device which can simultaneously inspect all chips loaded on the test board as well as all chips formed on the semiconductor wafer. That is, the object which can be tested by the present invention is not limited to the package structure. Also, since the retaining structure of the contact assembly is made from a material having a low thermal expansion coefficient, the expansion of the contact assembly is suppressed, and the position error of the probes is not generated although the pads to be inspected are arranged with a very small pitch. Accordingly, the inspection can be achieved under the high temperature, especially, when a temperature and voltage test is performed.

Further, although the chips become more and more compact as the wafer becomes larger in diameter, the present invention can sufficiently cope with such a structure by enlarging the retaining structure of the contact assembly in the XY directions.

Although the embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A contact assembly mounted between an electronic device to be tested and a circuit inspecting device to electrically connect the electronic device to the circuit inspecting device, the contact assembly comprising:

contacts, each of which includes vertical type probes and a ribbon-shaped resin film to which the vertical type probes are mounted apart from each other in a longitudinal direction of the ribbon-shaped resin film, each of the vertical type probes including a first terminal which contacts a pad of the electronic device to be tested, a second terminal which contacts a pad of the circuit inspecting device, and an elastic deforming part which is formed between the first terminal and the second terminal;

a position determining member for overlapping the contacts in the longitudinal direction of the contact such that the contacts are separated from each other and the vertical type probes are arranged misalignedly by a predetermined pitch in the longitudinal direction of the ribbon- shaped resin film, and fixing the contacts in a width direction; and a guide block that is formed with an opening for receiving the contacts fixed by the position determining member and recesses in which the position determining member is seated, the guide block having a thickness which is substantially same as a width of the contact, wherein the first terminals and the second terminals of the vertical type probes protrude above and below surface planes of the guide block, respectively.

2. The contact assembly according to claim 1, wherein the elastic deforming part is formed in a U-shaped curve which extends along the longitudinal direction of the ribbon-shaped resin film, and the first terminal and the second terminal are formed at both ends of the elastic deforming part and protrude outward perpendicular to both longitudinal sides of the ribbon-shaped resin film, and the ribbon-shaped resin film is formed with a slot at a location surrounded by the elastic deforming part.

3. The contact assembly according to claim 2, wherein the vertical type probes have the ends of the curve protruding perpendicularly from both sides in the longitudinal direction of the ribbon-shaped resin film, the first terminal being an input terminal which contacts the pad of the electronic device to be tested, and the second terminal being an output terminal which contacts a circuit wire pad of an inspecting circuit board.

4. The contact assembly according to claim 2, wherein the ribbon-shaped resin film is connected to the vertical type probe by a beam structure, the beam being a portion adjacent to the slot of the ribbon-shaped resin film having the same width as a width of the elastic deforming part, and when a contacting pressure is applied to the vertical type probe, the ribbon-shaped resin film is deformed elastically together with the vertical type probe.

5. The contact assembly according to claim 1, wherein the first terminals and the second terminals of the vertical type probes which are overlapped are arranged linearly with an angle which is derived from the following equation:

$$\sin\theta = t/p$$

here, $\theta$ means the angle, I means a thickness of the contact, and p means a pitch of the pads of the electronic device to be tested, which are arranged in a lattice shape.

6. The contact assembly according to claim 1, wherein the position determining member is a coupling rod, and the contacts are formed with through-holes through which the coupling rod is inserted for fixing the contacts which are overlapped so that the first terminals of the vertical type probes correspond to the pads of the electronic device to be tested.

7. The contact assembly according to claim 5, wherein the electronic device to be tested in contact with the input terminal protruding from the guide block is mounted slantly with the angle $\theta$ with respect to a longitudinal direction of the guide block.

8. The contact assembly according to claim 1, wherein the circuit inspecting device includes at least one inspection circuit board having circuit wires which contact the second terminal protruding from the guide block, and the inspection circuit board is formed with an extending portion which is inserted into a connector socket to electrically connect the electronic device to be tested to the circuit inspecting device.

9. The contact assembly according to claim 8, wherein the circuit inspecting device includes an upper inspection circuit board and a lower inspection circuit board disposed under the upper inspection circuit board, and the upper inspection circuit board is formed with through-holes through which parts of the second terminals of the vertical type probes pass to contact circuit wire pads of the lower inspection circuit board.

10. The contact assembly according to claim 1, wherein the contacts which are overlapped are fixedly adhered to each other by an adhesive agent of an organic insulating material, and a gap between two adjacent ribbon-shaped resin films is defined by a thickness of the adhesive agent.

* * * * *